(12) United States Patent
Zihir et al.

(10) Patent No.: US 11,043,753 B2
(45) Date of Patent: Jun. 22, 2021

(54) METHOD FOR SEPARATELY BIASING POWER AMPLIFIER FOR ADDITIONAL POWER CONTROL

(71) Applicant: Integrated Device Technology, Inc., San Jose, CA (US)

(72) Inventors: Samet Zihir, San Diego, CA (US); Tumay Kanar, San Diego, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 250 days.

(21) Appl. No.: 16/132,877

(22) Filed: Sep. 17, 2018

(65) Prior Publication Data

US 2019/0089070 A1 Mar. 21, 2019

Related U.S. Application Data

(60) Provisional application No. 62/575,346, filed on Oct. 20, 2017, provisional application No. 62/560,173, (Continued)

(51) Int. Cl.
*H01Q 21/22* (2006.01)
*H01Q 21/24* (2006.01)
(Continued)

(52) U.S. Cl.
CPC .............. *H01Q 21/22* (2013.01); *H01Q 1/26* (2013.01); *H01Q 3/28* (2013.01); *H01Q 3/36* (2013.01);
(Continued)

(58) Field of Classification Search
CPC ........ H01Q 21/22; H01Q 21/065; H01Q 3/40; H01Q 3/36; H01Q 1/26; H01Q 3/46; H01Q 21/0025; H01Q 21/067; H01Q 21/205; H01Q 21/24; H01Q 3/28; H03F 3/4508; H03F 3/195; H03F 3/245; H03F 3/45085; H03F 2203/45302; H03F 2203/45394; H03F 2200/09; H03F 2200/129; H03F 2200/144; H03F 2200/27; H03F 2200/387; H03F 2200/451; H03F 2203/45116; H03F 2203/45151; H03F 2203/45512; H03F 2203/45526; H03F 2203/45528;
(Continued)

(56) References Cited

U.S. PATENT DOCUMENTS

| | | | |
|---|---|---|---|
| 2013/0088381 A1* | 4/2013 | Puzella | H01Q 25/02 342/154 |
| 2015/0194942 A1* | 7/2015 | Anderson | H03F 3/195 330/295 |

* cited by examiner

*Primary Examiner* — Fitwi Y Hailegiorgis
(74) *Attorney, Agent, or Firm* — Christopher P. Maiorana, PC

(57) ABSTRACT

An apparatus includes a phased array antenna panel and one or more beam former circuits mounted on the phased array antenna panel. The phased array antenna panel generally comprises a plurality of antenna elements. The plurality of antenna elements are generally arranged in one or more groups. Each beam former circuit may be coupled to a respective group of the antenna elements. Each beam former circuit generally comprises a plurality of transceiver channels. Each transceiver channel generally comprises a power amplifier circuit configured, when operating in a transmit mode, to drive a respective one of the antenna elements. The power amplifier circuit generally comprises separate bias and voltage supply inputs providing additional power control.

18 Claims, 12 Drawing Sheets

Related U.S. Application Data filed on Sep. 18, 2017, provisional application No. 62/559,875, filed on Sep. 18, 2017.

(51) Int. Cl.
| | |
|---|---|
| *H01Q 3/28* | (2006.01) |
| *H03F 3/45* | (2006.01) |
| *H04B 7/06* | (2006.01) |
| *H01Q 21/06* | (2006.01) |
| *H01Q 3/40* | (2006.01) |
| *H03F 3/195* | (2006.01) |
| *H03F 3/24* | (2006.01) |
| *H04B 1/401* | (2015.01) |
| *H01Q 3/36* | (2006.01) |
| *H04B 1/44* | (2006.01) |
| *H01Q 1/26* | (2006.01) |
| *H01Q 3/46* | (2006.01) |
| *H01Q 21/00* | (2006.01) |
| *H01Q 21/20* | (2006.01) |

(52) U.S. Cl.
CPC .................. *H01Q 3/40* (2013.01); *H01Q 3/46* (2013.01); *H01Q 21/0025* (2013.01); *H01Q 21/065* (2013.01); *H01Q 21/067* (2013.01); *H01Q 21/205* (2013.01); *H01Q 21/24* (2013.01); *H03F 3/195* (2013.01); *H03F 3/245* (2013.01); *H03F 3/4508* (2013.01); *H03F 3/45085* (2013.01); *H04B 1/401* (2013.01); *H04B 1/44* (2013.01); *H04B 7/0617* (2013.01); *H04B 7/0682* (2013.01); *H04B 7/0691* (2013.01); *H03F 2200/09* (2013.01); *H03F 2200/129* (2013.01); *H03F 2200/144* (2013.01); *H03F 2200/27* (2013.01); *H03F 2200/387* (2013.01); *H03F 2200/451* (2013.01); *H03F 2203/45116* (2013.01); *H03F 2203/45151* (2013.01); *H03F 2203/45302* (2013.01); *H03F 2203/45394* (2013.01); *H03F 2203/45512* (2013.01); *H03F 2203/45526* (2013.01); *H03F 2203/45528* (2013.01)

(58) Field of Classification Search
CPC .... H04B 7/0617; H04B 7/0691; H04B 1/401; H04B 7/0682; H04B 1/44
USPC .......................... 375/267; 342/154; 330/295
See application file for complete search history.

METHOD FOR SEPARATELY BIASING POWER AMPLIFIER FOR ADDITIONAL POWER CONTROL

This application relates to U.S. Provisional Application No. 62/559,875, filed Sep. 18, 2017, U.S. Provisional Application No. 62/560,173, filed Sep. 18, 2017, and U.S. Provisional Application No. 62/575,346, filed Oct. 20, 2017, which are hereby incorporated by reference in their entirety.

FIELD OF THE INVENTION

The invention relates to radio-frequency beam forming generally and, more particularly, to a method and/or apparatus for separately biasing a power amplifier for additional power control.

BACKGROUND

Phased array antenna panels are used to generate steerable beams that may be utilized in wireless communication systems. Phased arrays create a focused beam that can be steered very quickly to maintain a link for any on-the-move communication system. Conventional wireless communications systems can also utilize steerable beams to communicate with multiple wireless nodes by moving the beams from one wireless node to the next. A single beam may service multiple wireless nodes in a sequence and repeat the sequence periodically such that each wireless node appears to be in constant communications with the system. The beam steering is generally implemented by loading predetermined parameters into appropriate circuitry of the phased array panels to adjust the beam(s).

It would be desirable to implement a method for separately biasing a power amplifier for additional power control.

SUMMARY

The invention concerns an apparatus including a phased array antenna panel and one or more beam former circuits mounted on the phased array antenna panel. The phased array antenna panel generally comprises a plurality of antenna elements. The plurality of antenna elements are generally arranged in one or more groups. Each beam former circuit may be coupled to a respective group of the antenna elements. Each beam former circuit generally comprises a plurality of transceiver channels. Each transceiver channel generally comprises a power amplifier circuit configured, when operating in a transmit mode, to drive a respective one of the antenna elements. The power amplifier circuit generally comprises separate bias and voltage supply inputs providing additional power control.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a method and/or apparatus for separately biasing a power amplifier for additional power control that may (i) provide same efficiency while lowering the output power, (ii) provide independent biasing of vertical and horizontal channels, (iii) provide independent gain control of vertical and horizontal channels, (iv) implement separate power (VDD) pin for power amplifier, (v) allow power consumption to be lowered without lowering gain, (vi) provide separate reference current weighting structures, (vii) be separately programmed via a serial interface, and/or (viii) be implemented as one or more integrated circuits.

Figure 1:
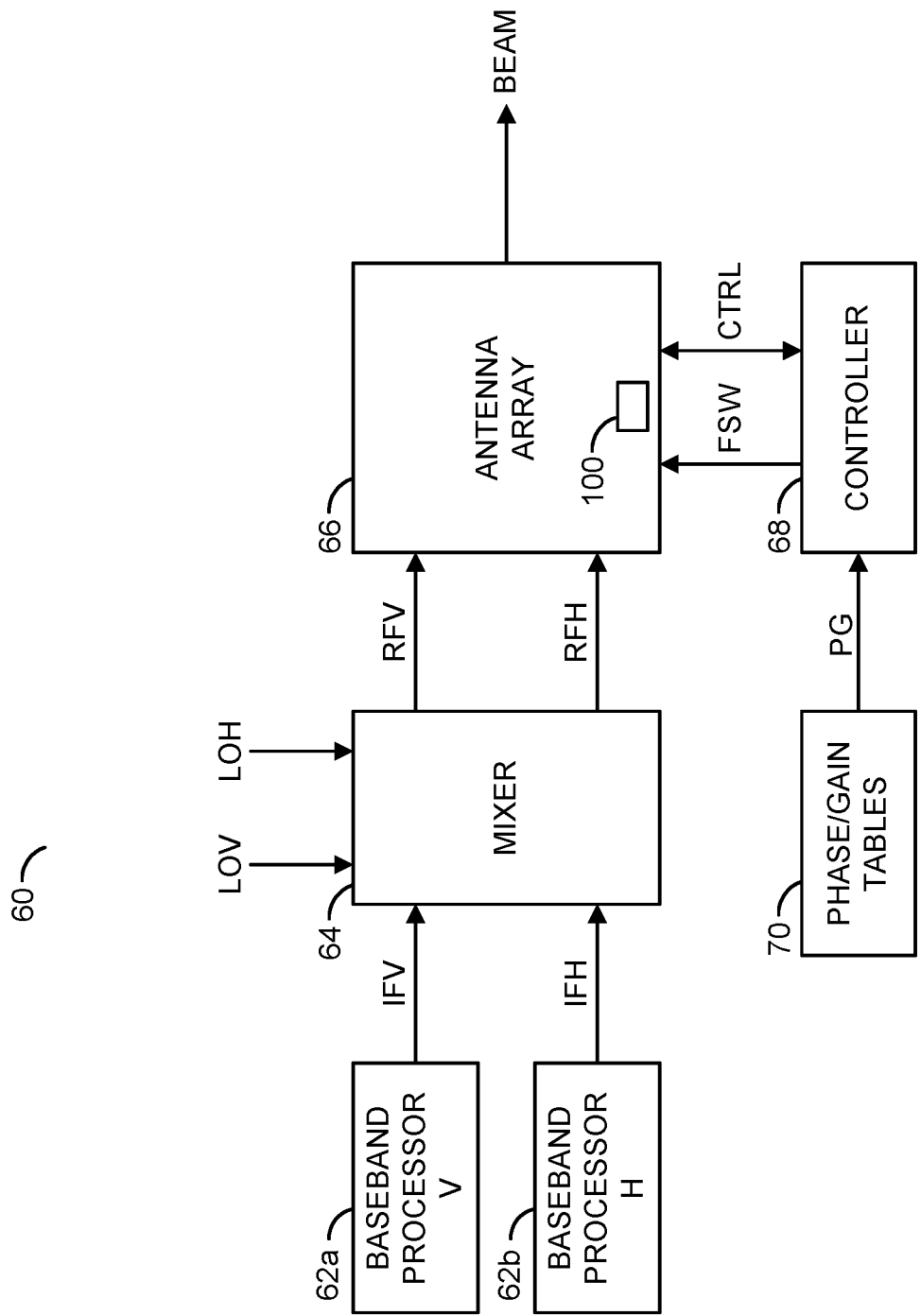
FIG. 1 is a diagram of a system illustrating an example context of the invention.

Referring to FIG. 1, a block diagram of a system 60 illustrating a context of the invention is shown. The system (or module or circuit or apparatus) 60 may implement a radio-frequency (RF) transceiver system in accordance with an example embodiment of the invention. The RF transceiver system 60 may be configured to operate at common wireless radio frequencies, millimeter-wave frequencies, and/or microwave frequencies. In various embodiments, the RF transceiver system 60 may form part of a long range communications link. In various embodiments, the long range communications link may be part of a fifth generation (5G) wireless communications system (e.g., for which a standard is currently under development by the Next Generation Mobile Networks (NGMN) Alliance). In other embodiments, the long range communications link may be part of a fourth generation (4G) wireless communications system (e.g., International Mobile Telecommunications-Advanced (IMT-A) standard published by the International Telecommunications Unit Radiocommunication Sector (ITU-R)). However, other communications standards may be implemented to meet the design criteria of a particular application. The RF transceiver system 60 is generally described using a dual-polarization embodiment. However, single-polarization embodiments of the RF transceiver system 60 may be implemented similarly, as would be apparent to a skilled artisan in the field of the invention.

The RF transceiver system 60 generally comprises multiple blocks (or circuits) 62a-62b, a block (or circuit) 64, a block (or circuit) 66, a block (or circuit) 68 and a block (or circuit) 70. The circuit 66 generally comprises multiple blocks (or circuits) 100 (one shown for clarity). The circuits 62-100 may be implemented with hardware, a combination of hardware and software and/or simulated with software.

A signal (e.g., IFV) may be exchanged between the circuits 62a and the circuit 64. A signal (e.g., IFH) may be exchanged between the circuits 62b and the circuit 64. The signal IFV may implement an intermediate-frequency signal carrying information to be transmitted with a vertical polarization from and/or received by the RF transceiver system 60. The signal IFH may implement an intermediate-frequency signal carrying information to be transmitted with a horizontal polarization from and/or received by the RF transceiver system 60. Signals (e.g., LOV and LOH) may be received by the circuit 64. The signals LOV and LOH may implement local oscillator signals, one for each polarization. A signal (e.g., RFV) may be exchanged between the circuit 64 and the circuit 66. The signal RFV may be a radio-frequency signal that conveys the information also found in the intermediate-frequency signal IFV. A signal (e.g., RFH) may be exchanged between the circuit 64 and the circuit 66. The signal RFH may be a radio-frequency signal that conveys the information also found in the intermediate-frequency signal IFH. In a transmit mode, the radio-frequency signals RFV and RFH may convey information to broadcast from the circuit 66. In a receive mode, the radio-frequency signals RFV and RFH may convey information received by the circuit 66. A field (e.g., BEAM) may be generated by the circuit 66. The field BEAM may represent a field pattern (or a radio-frequency beam pattern) created by the circuit 66. A signal (e.g., FSW) and a signal or signals (e.g., CTRL) may be exchanged between the circuit 66 and the circuit 68. The signal FSW may switch the circuit 66 between a transmit mode and a receive mode. The signal(s) CTRL may convey data, clocking, and control elements. In an example, the signals FSW and CTRL may be part of a digital interface of the circuit 66. In an example, the signal(s) CTRL may be implemented as a serial link that conveys information for configuring and/or determining phase and/or gain settings for antenna elements of the circuit 66. In an example, the signal(s) CTRL may be compliant with one or more serial communication protocols or interfaces (e.g., serial peripheral interface (SPI), inter-integrated circuit communications ($I^2C$), daisy chain, etc.). A signal (e.g., PG) may be transferred from the circuit 70 to the circuit 68. The signal PG may convey phase information and gain information used by the circuits 66 and 68 to control steering of the field BEAM.

Each circuit 62a-62b may implement a baseband processor circuit. The baseband processor circuits 62a-62b are generally operational to process the information sent by and/or received in the intermediate-frequency signals IFV and IFH. The baseband processor circuit 62a may process vertically polarized information in the RF transceiver system 60. The baseband processor circuit 62b may process horizontally polarized information in the RF transceiver system 60. The processing may include, but is not limited to, modulation/demodulation of the radio signal that contains the information and management of simultaneous communications between the RF transceiver system 60 and multiple remote terminals.

The circuit 64 may implement one or more mixer circuits. The mixer 64 is generally operational to frequency convert between an intermediate frequency used for the signals IFV and IFH and the radio frequency used for the signals RFV and RFH. The frequency conversion may be based on local oscillator frequencies of the local oscillator signals LOV and LOH. In various embodiments, each common radio-frequency signal RFV and RFH may be in a range of frequencies centered around approximately 28 gigahertz (GHz) or 39 GHz (e.g., 24 GHz to 30 GHz or 37 GHz to 44 GHz). Each intermediate frequency may cover a band from approximately 2 GHz to 6 GHz (e.g., an approximately 4 GHz bandwidth). Each local oscillator frequency may range from approximately 22 GHz to 26 GHz while the signals RFV and/or RFH are at 28 GHz. Each local oscillator frequency may range from approximately 33 GHz to 37 GHz while the signals RFV and/or RFH are at 39 GHz. Other frequency ranges may be implemented to meet the design criteria of a particular application.

The circuit 66 may implement a dual-pole antenna array. The antenna array 66 may be operational to transmit and receive wireless signals to and from devices (or terminals) remotely located from the RF transceiver system 60. Sensitivity to the wireless signals may be determined by the field BEAM created by the antenna array 66. The antenna array 66 may comprise a number (e.g., N) of antenna elements and a similar number of transceiver channels. The N transceiver channels may be coupled by corresponding bidirectional radio-frequency signals to the N antenna elements. The transceiver channels and antenna elements generally form a two-dimensional antenna network. In various embodiments, the antenna array 66 may be implemented as a patch antenna or a phased array antenna.

The circuit 68 may implement a controller circuit. The controller 68 is generally operational to control the operations of the antenna array 66. In some embodiments, the controller 68 may determine the setting values used in each transceiver channel within the beam former circuit 66 to establish the geometry of the field BEAM. In various embodiments, the controller 68 may be implemented as one or more integrated circuits.

The circuit 70 may implement a table in a memory circuit. The table 70 may be configured to store multiple gain values and multiple phase values used by the transceiver channels in the antenna array 66 to establish the field BEAM. The phase values and the gain values may be loaded from the table 70 into buffers within antenna array 66 by the controller 68. In various embodiments, the memory storing the table 70 may be implemented on the same integrated circuit as the controller 68.

Each circuit 100 may implement a beam former circuit. The beam former circuits 100 are generally operational to multiplex/demultiplex the signals RFV and RFH with multiple antenna elements in the antenna array 66. The beam former circuit 100 may also be operational to control the shape, direction and magnitude of the field BEAM based on phase information and gain information received through the signal CTRL.

Figure 2:
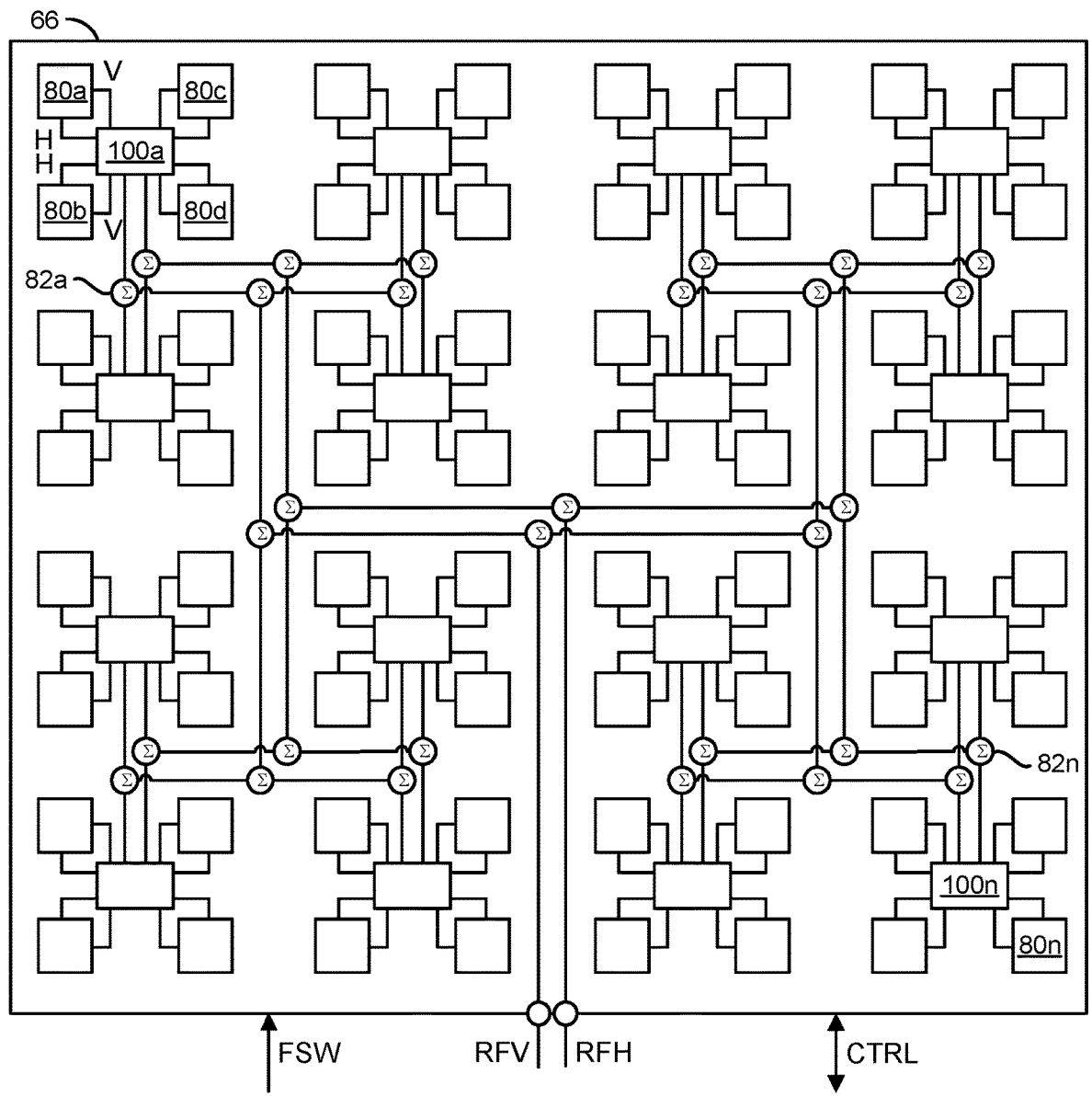
FIG. 2 is a diagram illustrating an example implementation of a phased array antenna panel in accordance with an example embodiment of the invention.

Referring to FIG. 2, a diagram of an example implementation of the antenna array 66 is shown in accordance with an embodiment of the invention. The antenna array 66 generally comprises multiple blocks (or circuits) 80a-80n, multiple blocks (or circuits) 82a-82n and multiple blocks (or circuits) 100a-100n. The circuits 80a-100n may be implemented with hardware, a combination of hardware and software and/or simulated with software.

The signals RFV and RFH may be exchanged with two of the circuits 82a-82n. The signals FSW and CTRL may be exchanged with all of the circuits 100a-100n.

Each circuit 80a-80n may implement an antenna element. The antenna elements 80a-80n in the antenna array 66 may be used for both transmission and reception. In various embodiments, each antenna element 80a-80n may be implemented as a dual-pole antenna. A physical positioning of the antenna elements 80a-80n generally provides a two-dimensional (e.g., horizontal and vertical) control of the field BEAM.

Each circuit 82a-82n may implement a combiner circuit. In various embodiments, each combiner circuit 82a-82n may be implemented as a Wilkinson combiner circuit. The combiner circuits 82a-82n may be arranged as two sets of combiner circuits, a set for routing of the signal RFV and another set for the routing of the signal RFH. In the transmit mode, the combiner circuits 82a-82n are generally operational to distribute the power in the common signals RFV and RFH to the circuits 100a-100n. In the receive mode, the combiner circuits 82a-82n may be operational to combine the power received in signals from the circuits 100a-100n into the signals RFV and RFH.

Each circuit 100a-100n may implement one of the beam former circuits 100. The beam former circuits 100a-100n are generally operational to multiplex/demultiplex the signals RFV and RFH with multiple (e.g., N) antenna elements 80a-80n. The beam former circuits 100a-100n may also be operational to change setting values rapidly (e.g., phase values and gain values) used by the transceiver channels to steer the field BEAM formed by the antenna array 66. In various embodiments, each beam former circuit 100a-100n may be implemented as one or more integrated circuits in a package. Each packed beam former circuit 100a-100n may be mounted on a substrate of the antenna array 66 at a center of four neighboring antenna elements 80a-80n.

Figure 3:
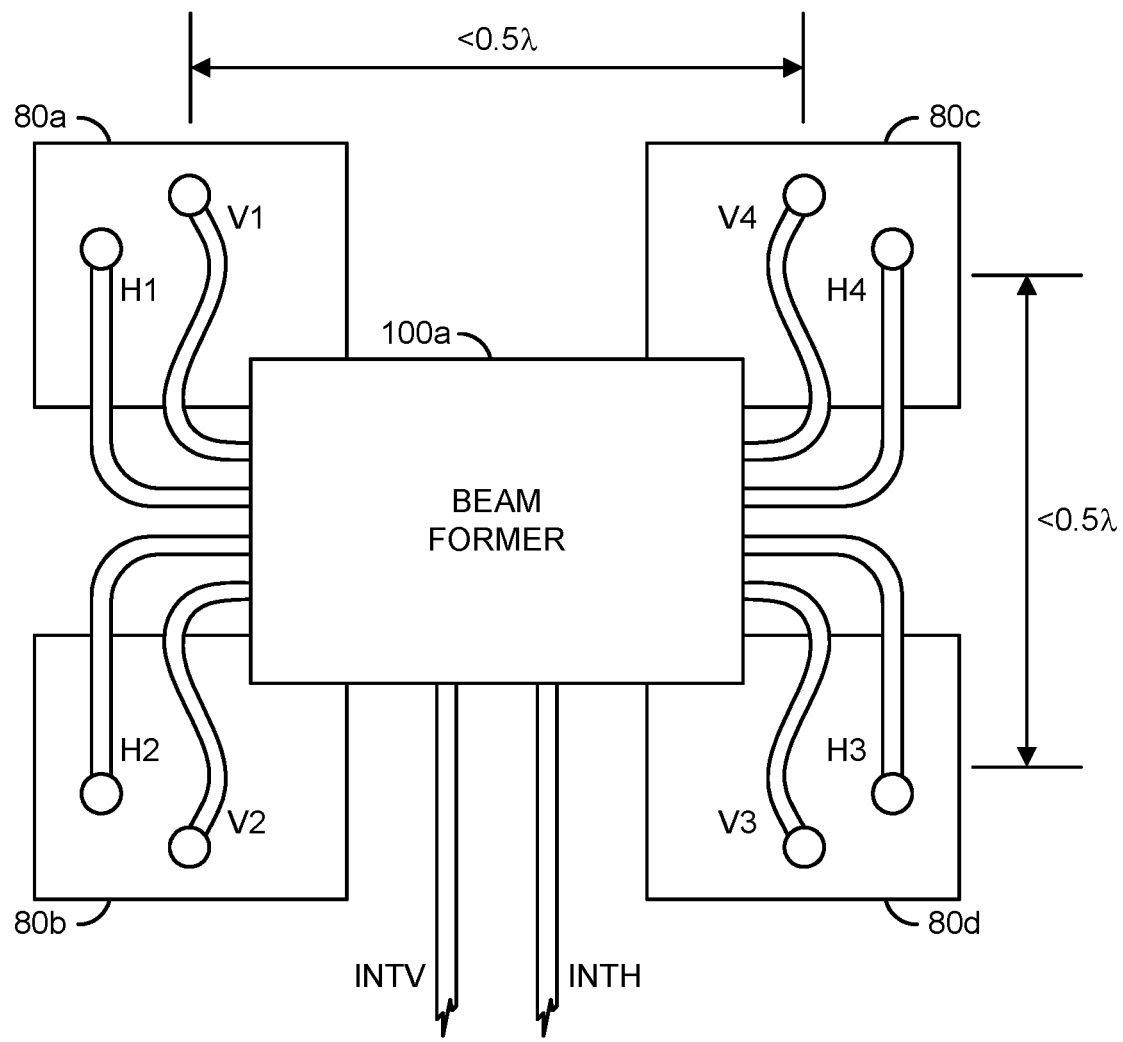
FIG. 3 is a layout diagram of a beam former circuit and neighboring antenna elements in accordance with an example embodiment of the invention.

Referring to FIG. 3, a diagram is shown illustrating an example layout of the beam former circuit 100a and neighboring antenna elements 80a-80d in accordance with an embodiment of the invention. The beam former circuit 100a may be representative of the beam former circuits 100a-100n. The set of four antenna elements 80a-80d may be representative of the antennal elements 80a-80n. The antenna elements 80a-80d are generally spaced apart from each other by less than a half-wavelength (e.g., less than 5 millimeters (mm)) in both a horizontal direction and a vertical direction. In various embodiments for a dual-polarization implementation, the packaged beam former circuit 100a may also have dimensions of less than a half-wavelength (e.g., 3.3 mm by 4.8 mm) in both a horizontal direction and a vertical direction. In other embodiments for single-polarization implementation, the packaged beam former circuit 100a may have a smaller footprint (e.g., 3.36 mm by 3.5 mm). Each beam former circuit 100a-100n (e.g., 100a shown) may be mounted on a substrate of the antenna array 66 at a center of four neighboring antenna elements 80a-80n (e.g., 80a-80d shown).

Traces in a single conductive (e.g., metal) layer of the substrate may spatially route signals into alignment between the beam former circuits 100a-100n to the antenna elements 80a-80n. For example, the single conductive layer may be the layer adjoining input/output pads of the beam former circuit 100a-100n. The traces may remain in the single conductive layer until aligned with the input/output pads of the antenna elements 80a-80n. Through-substrate vias may provide connections from the traces to the antenna elements 80a-80n.

In some embodiments, each antenna element 80a-80n may be connected to a corresponding beam former circuit 100a-100n with two traces/through-substrate vias. One of the two traces/vias may convey a horizontally-polarized signal (e.g., H1-H4 shown). Another trace/via may convey a vertically-polarized signal (e.g., V1-V4 shown). The traces in the single conductive layer of the substrate may also directly connect the beam former circuits 100a-100n to the combiner circuits 82a-82n (see FIG. 2). In various embodiments, each beam former circuit 100a-100n may be directly connected by two traces to two corresponding combiner circuits 82a-82n. For example, a trace may carry a signal (e.g., INTV). Another trace may carry a signal (e.g., INTH). In an example, the signals INTV and INTH may comprise a portion of the power of the signals RFV and RFH, respectively, directed to the respective beam former circuit 100a-100n. The small package size may provide reduced power consumption compared with common designs. The reduced power consumption may provide better thermal performance compared with common designs.

Implementing the VH-HV configuration generally minimizes the loss and possible crossovers. Having lower loss in the antenna interface may improve a receive gain and/or a transmit gain. The lower loss may improve a total gain budget multiple (e.g., 2) times, once on the receiving side and once on the transmitting side in configurations where two of the panels are used in a transmit-receive communication system. The lower loss may provide flexibility for the beam former circuits 100a-100n to utilize a lower output power that is saved from the connection. The lower output power generally means lower power consumption and better thermal consumption. Up to a few (e.g., 1-2) decibels improvement may result in a modest (e.g., 20-30%) power consumption improvement and a relative thermal performance improvement. The same may apply for the receive mode and lower power consumption to achieve relaxed 5G New Radio specification criteria.

Figure 4:
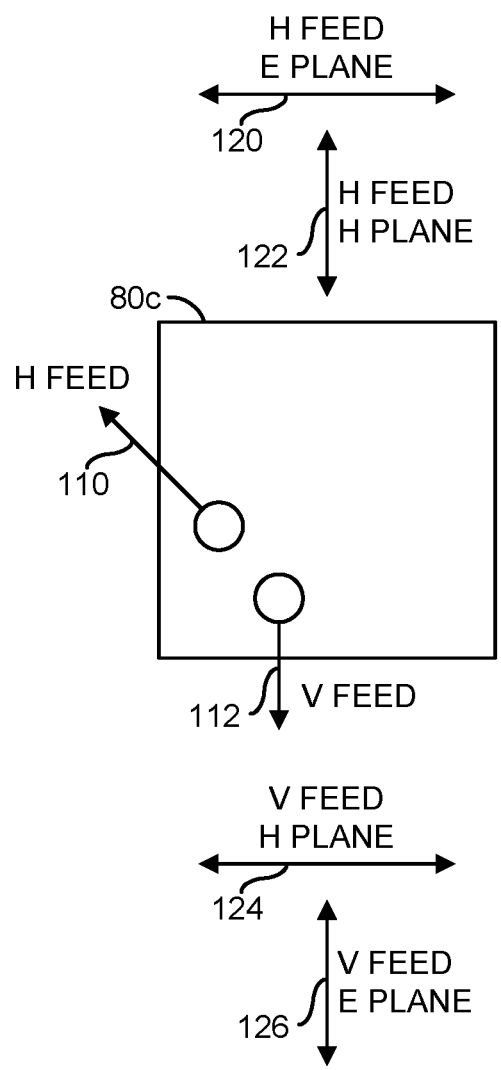
FIG. 4 is a layout diagram of a top side of an antenna element in accordance with an example embodiment of the invention.

Referring to FIG. 4, a diagram of an example layout of a top side of an antenna element 80c is shown in accordance with an embodiment of the invention. The antenna element 80c generally comprises two feeds 110 and 112. The feed 110 may implement a horizontal feed. The horizontal feed 110 is generally coupled to a horizontally-polarized port 108a-108d of a neighboring beam former circuit 100a-100n. The feed 112 may implement a vertical feed. The vertical feed 112 is generally coupled to a horizontally-polarized port 106a-106d of a neighboring beam former circuit 100a-100n.

The antenna element 80c may be sensitive along a horizontal electrical (E) plane 120 and a vertical magnetic (H) plane 122. The electrical plane 120 and the magnetic plane 122 may be coupled to the horizontal feed 110. The antenna element 80 may be sensitive along a horizontal magnetic (H) plane 124 and a vertical electric (E) plane 126. The magnetic plane 124 and the electric plane 126 may be coupled to the horizontal feed 112.

To minimize the coupling between the V-planes and the H-planes of each antenna element 80a-80n, the V-plane feed lines and the H-plane feed lines may be electrically and/or physically isolated. Any cross-overs and/or proximity between the lines may lower the isolation. Various embodiments of the invention may eliminate the cross-overs. Some embodiments may also maximize the distance between the feed lines. The isolation generally improves the unwanted coupling between the V-planes and the H-planes and minimizes the leakage of electromagnetic waves between the feeds.

Figure 5:
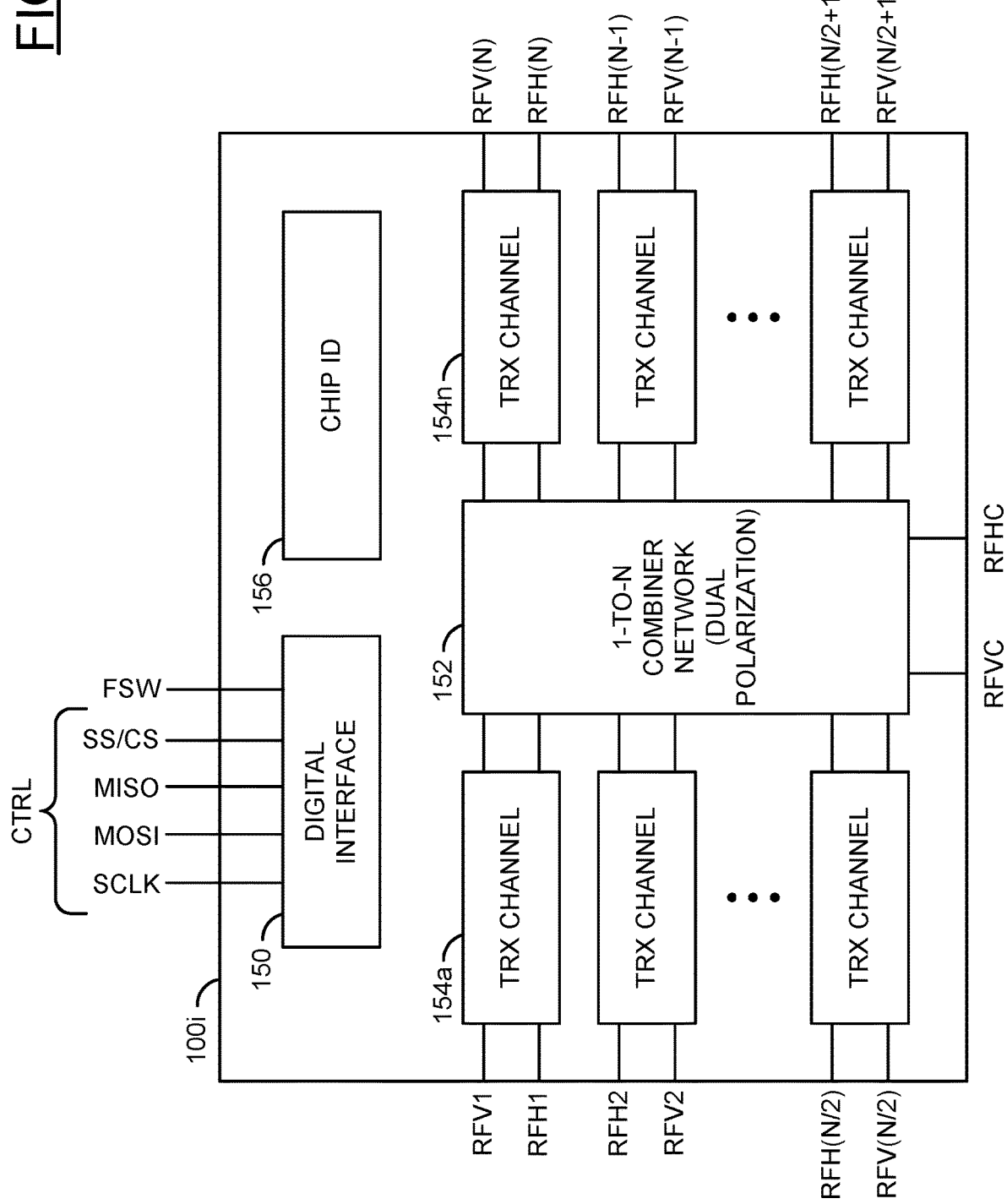
FIG. 5 is a diagram illustrating a generic dual-polarization beam former circuit in accordance with an example embodiment of the invention.

Referring to FIG. 5, a diagram is shown illustrating an example implementation of a dual-polarization beam former circuit 100*i* in accordance with an example embodiment of the invention. In an example, the dual-polarization beam former circuit 100*i* may be representative of the dual-polarization beam former circuits 100*a* 100*m* of FIG. 2. In an example, the dual-polarization beam former circuit 100*i* may have a digital interface configured to receive the signal FSW and the signal(s) CTRL, a first common RF input/output port (RFVC), a second common RF input/output port (RFHC), a number of vertical antenna input/output ports (RFV1-RFV(N)), and a number of horizontal antenna input/output port (RFH1-RFH(N)). In general, any number (e.g., N) of vertical and horizontal antenna input/output ports (or channels) may be implemented accordingly to meet design criteria of a particular implementation.

In various embodiments, the signal INTV may be presented/received by the common RF input/output RFVC, the signal INTH may be presented/received by the common RF input/output RFHC, the vertical antenna input/output ports RFV1-RFV(N) may be coupled to corresponding vertical input/outputs of the respective antenna elements 80, and the horizontal antenna input/output ports RFH1-RFH(N) may be coupled to corresponding horizontal input/outputs of the respective antenna elements 80. The dual-polarization beam former circuit 100*i* generally implements a number (e.g., N) of transceiver channels corresponding to the number of pairs of vertical and horizontal antenna input/output ports (RFV1, RFH1), (RFV2, RFH2), ... (RFV(N), RFH(N)). In various embodiments, each of the transceiver channels may comprise a respective transmit channel and a respective receive channel. The transceiver channels are generally configured to switch between transmitting or receiving based upon the signal FSW.

The dual-polarization beam former circuit 100*i* generally implements a transmit mode and a receive mode. In an example, a state of the signal FSW may determine whether the transmit mode or the receive mode is active. In the transmit mode, the dual-polarization beam former circuit 100*i* is generally configured to receive radio frequency signals at the common input/output ports RFVC and RFHC, and present radio frequency signals at the antenna input/output ports RFV1-RFV(N) and RFH1-RFH(N). The signals presented at each of the antenna input/output ports RFV1-RFV(N) and RFH1-RFH(N) are generated by the dual-polarization beam former circuit 100*i* in response to the radio frequency signals received at the common input/output ports RFVC and RFHC and a respective number of setting values (e.g., gain, phase, etc.) corresponding to each of the antenna input/output ports RFV1-RFV(N) and RFH1-RFH (N).

In an example, the dual-polarization beam former circuit 100*i* may comprise a block (or circuit) 150, a block (or circuit) 152, a number of blocks (circuits) 154*a*-154*n*, and a block (or circuit) 156. The circuit 150 may implement an interface circuit. In various embodiments, the circuit 150 may implement a digital interface. The circuit 152 may implement a 1-N dual-channel combiner/splitter network. The circuits 154*a*-154*n* may implement transceiver (TRX) channels. The circuit 156 may implement a hard-wired address (e.g., chip ID) for the beam former circuit 100*i*.

In an example, the signals FSW and CTRL are exchanged with the circuit 150. In an example, the circuit 150 may comprise a serial interface. The circuit 150 may be configured to be compliant with one or more serial interface standards including, but not limited to, serial peripheral interface (SPI), inter-integrated circuit ($I^2C$), daisy chain, etc. In an example, the circuit 150 may be configured to allow programming and control of the dual-polarization beam former circuit 100*i* using a serial communication link (or bus). In an example, the circuit 150 may be configured to program and control the circuits 154*a*-154*n* in response to the signals CTRL and FSW. In an example, the circuit 150 may control whether the circuits 154*a*-154*n* operate in a transmit mode or a receive mode in response to the signal FSW.

In an example, the circuit 150 may implement a 4-wire embedded SPI core. In an example, the circuit 150 may have a first pin that may receive a first signal (e.g., MOSI), a second pin that may present a second signal (e.g., MISO), a clock input pin that may receive a clock signal (e.g., SCLK), and a chip enable (or chip select) pin that may receive a signal (e.g., SS/CS). In an example, the signals MOSI, MISO, SCLK, and SS/CS may be components of the signal(s) CTRL. In an example, the circuit 150 may include a transmit/receive function switching pin that may receive the signal FSW. In an example, the signals MOSI, MISO, SCLK, and SS/CS may be configured to implement the 4-wire SPI protocol interface as summarized in the following TABLE 1:

TABLE 1

| SIGNAL | FUNCTION |
| --- | --- |
| MOSI | Master out Slave in |
| MISO | Master in Slave out |
| SCLK | Serial clock |
| SS/CS | Slave Select/Chip Select |

In an example, the circuit 156 may set a physical address of the dual-polarization beam former circuit 100*i* based upon hardware coded address bits (or pins). In some embodiments, the hard-wired address bits may be hard coded within the chip implementing the beam former 100*i* during manufacturing. In some embodiments, the hard-wired address bits may be programmable within the chip implementing the beam former 100*i* during manufacturing. In some embodiments, the hard-wired address bits may be programmed using fuses, anti-fuses, or other conventional techniques.

Figure 6:
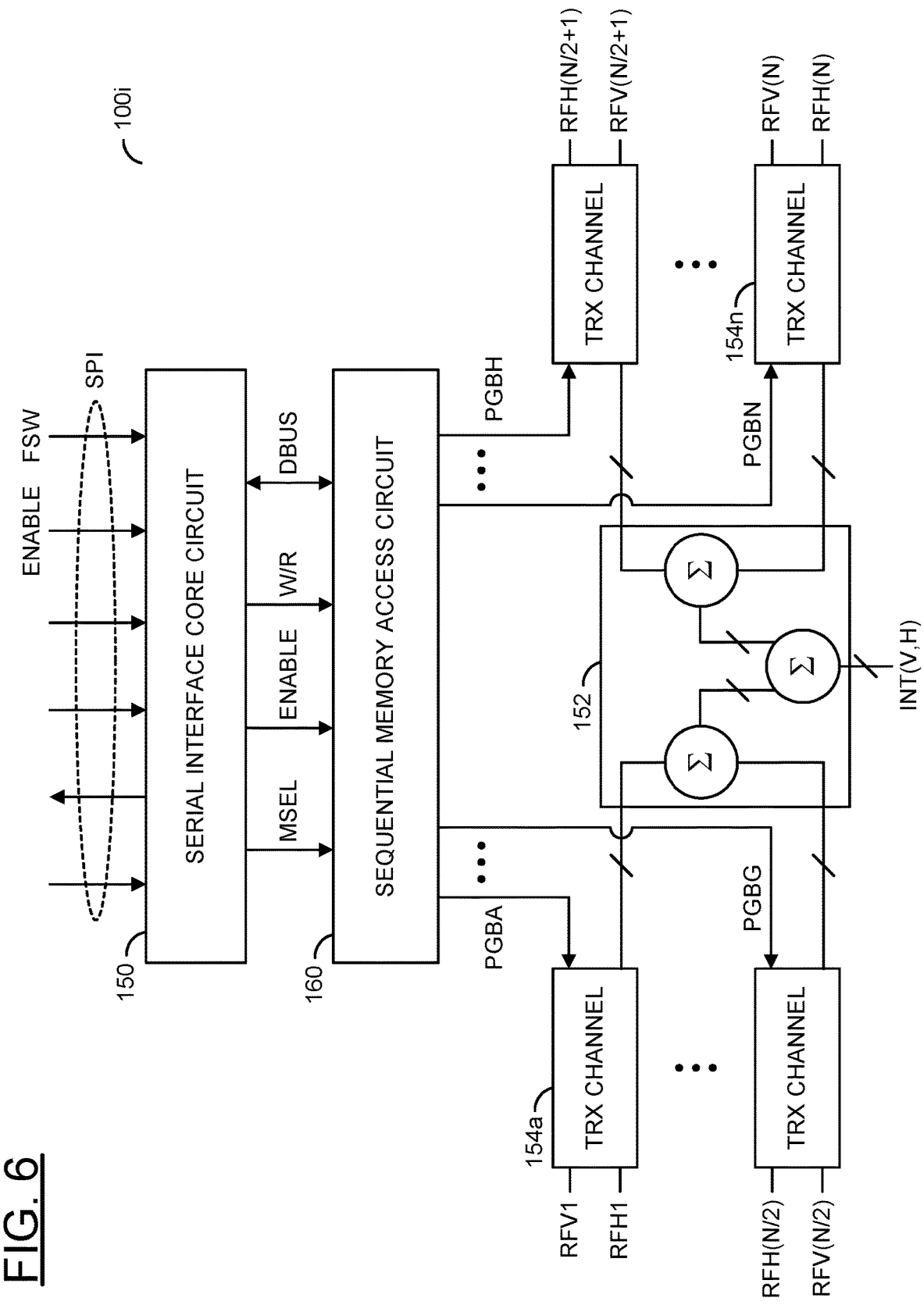
FIG. 6 is a diagram illustrating a fast memory access scheme for phase and gain control.

Referring to FIG. 6, a block diagram of an example implementation of a fast memory access architecture in accordance with an embodiment of the invention is shown. In an example, the beam former circuit 100*i* generally comprises the digital interface circuit 150, the transceiver circuits 154*a*-154*n*, the combiner/splitter circuit 152, and a block (or circuit) 160. The circuit 160 may be implemented with hardware, a combination of hardware and software and/or simulated with software.

A signal SPI may comprise multiple signals (e.g., CTRL, ENABLE, and FSW). The signals CTRL may comprise a number of serial bus signals used to convey data and commands between the controller 68 and the beam former circuit 100*i*. The signal ENABLE may be received by the circuit 150 and transferred to the circuit 160. The signal ENABLE may be an enable signal synchronized to a clock signal received as part of the signals CTRL. The circuit 150 may receive the signal FSW. The signal FSW may be a hard-wired fast T/R switch signal used to switch the beam former circuit 100*i* between the transmit mode and the receive mode.

A signal (e.g., MSEL) may be generated by the circuit 150 and received by the circuit 160. The signal MSEL may be a mode select signal that alternately enables and disables a fast phase/gain switching function of the beam former 100i. The signal ENABLE may be transferred from the controller 68 through the circuit 150 to the circuit 160. The circuit 150 may generate a signal (e.g., W/R) received by the circuit 160. The signal W/R may be a write/read signal. While in a write state, the signal W/R may indicate a write of gain values, phase values and/or bias values into buffers within the circuit 160. While in a read state, the signal W/R may indicate a read of the gain values, the phase values and/or the bias values from the circuit 160. A signal (e.g., DBUS) may be exchanged between the circuit 150 and the circuit 160. The signal DBUS may be a bidirectional data bus signal used to transfer the various values between the circuits 150 and 160 along a local data bus. Multiple signals (e.g., PGBA to PGBN) may be generated by the circuit 160 and transferred to the transceiver channel circuits 154a-154n, respectively. Each signal PGBA to PGBN may carry a current phase value (P), a current gain value (G) and a current bias value (B) to be used by the corresponding transceiver channel circuits 154a-154n.

The circuit 150 may implement a serial protocol interface (SPI) core circuit. When implemented as a SPI core, the circuit 150 may be operational to provide communications between the beam former circuit 100i and the controller 68 via the signals CTRL, ENABLE, and FSW. In various embodiments, the circuit 150 may control the setting values (e.g., the gain values and the phase values) and/or the bias values buffered in the circuit 160. The setting values may provide several tens (e.g., 35) of decibels (dB) of gain control for the field BEAM. The setting values may also provide multiple bits (e.g., 5 bits) of phase control for the field BEAM. Other gain ranges and/or phase ranges may be implemented to meet the design criteria of a particular application. Loading of the setting values into the buffers within the circuit 160 is generally controlled by the mode select signal MSEL and the enable signal ENABLE. A topology of the system 60 generally utilizes a single pad for the signal ENABLE at the circuit 150 to control sequential access to the register layers. The single pad approach generally reduces a number of pads compared with common multi-pad designs that implement random access addressing for the registers.

The circuit 150 may also be operational to control the transmit/receive mode of the transceiver circuits 154a-154n using the fast switching signal FSW. A switching speed from the transmit mode to the receive mode may be fast (e.g., less than or equal to about 30 nanoseconds). A switching speed from the receive mode to the transmit mode may be similarly fast (e.g., less than or equal to about 130 nanoseconds). The fast switching signal FSW may be toggled between the transmit mode and the receive mode at a high frequency (e.g., at least 10 megahertz). Other frequencies of the fast switching signal FSW may be implemented to meet the design criteria of a particular application.

The circuit 160 may implement a sequential memory access circuit (or access circuit for short). The circuit 160 is generally operational to buffer multiple subsets (or layers) of the gain values, the phase values and the bias values for each of the transceiver channel circuits 154a-154n. In various embodiments, the number of subsets may be an integer N (e.g., 4, 32, 128, etc.) to provide fast beam redirecting to N remote devices in short order. Other numbers of subsets may be implemented to meet the design criteria of a particular application.

While the mode select signal MSEL is in the enable state, when the signal ENABLE changes from a hold state (or mode) to a transfer state (or mode), the circuit 160 may be operational to switch to a next subset of the gain values and the phase values thereby causing the field BEAM to be directed among different remote devices. The switching of the subsets may be triggered by an edge in the signal ENABLE transitioning to the transfer state, or a level of the signal ENABLE being in the transfer state.

Each load operation of a new subset of the gain values and the phase values into the transceiver channel circuits 154a-154n generally causes the field BEAM to adjust to a new location. The new subset may also cause adjustments of the beam geometry. The adjustments are generally achieved within a short period (e.g., under 30 nanoseconds) to meet a low-latency criterion. Once the current field BEAM have been adjusted, the RF transceiver system 60 may communicate bidirectionally with one or more remote wireless devices generally aligned with at least one lobe in the field BEAM. The communication is typically achieved during a burst lasting a specified dwell period (e.g., approximately one microsecond). After the dwell period has ended, a next subset of the gain values and the phase values may be loaded into the transceiver channel circuits 154a-154n to cause more adjustments of the beam location and/or geometry. The next beam location and/or geometry may be suitable for bidirectional communications with a next remote wireless device. Afterwards, the RF transceiver system 60 may communicate bidirectionally with the next remote wireless device or devices for another predetermined dwell period. Other switching speeds and/or lengths of the predetermined period may be implemented to meet the design criteria of a particular application.

While the mode select signal MSEL is in the disable state, the access circuit 160 may configure a first of multiple register control signals to follow the signal ENABLE. The other register control signals may be deasserted. The pulses in the first register control signal that follow the pulses in the signal ENABLE may be used by a first register layer of the access circuit 160 to load the gain values, the phase values and/or the bias values presented by the circuit 150. In both single-polarization and dual-polarization embodiments, the circuit 160 may be implemented similarly to circuits described in co-owned U.S. patent application Ser. No. 15/817,909, filed Nov. 20, 2017, which is hereby incorporated by reference in its entirety.

Figure 7:
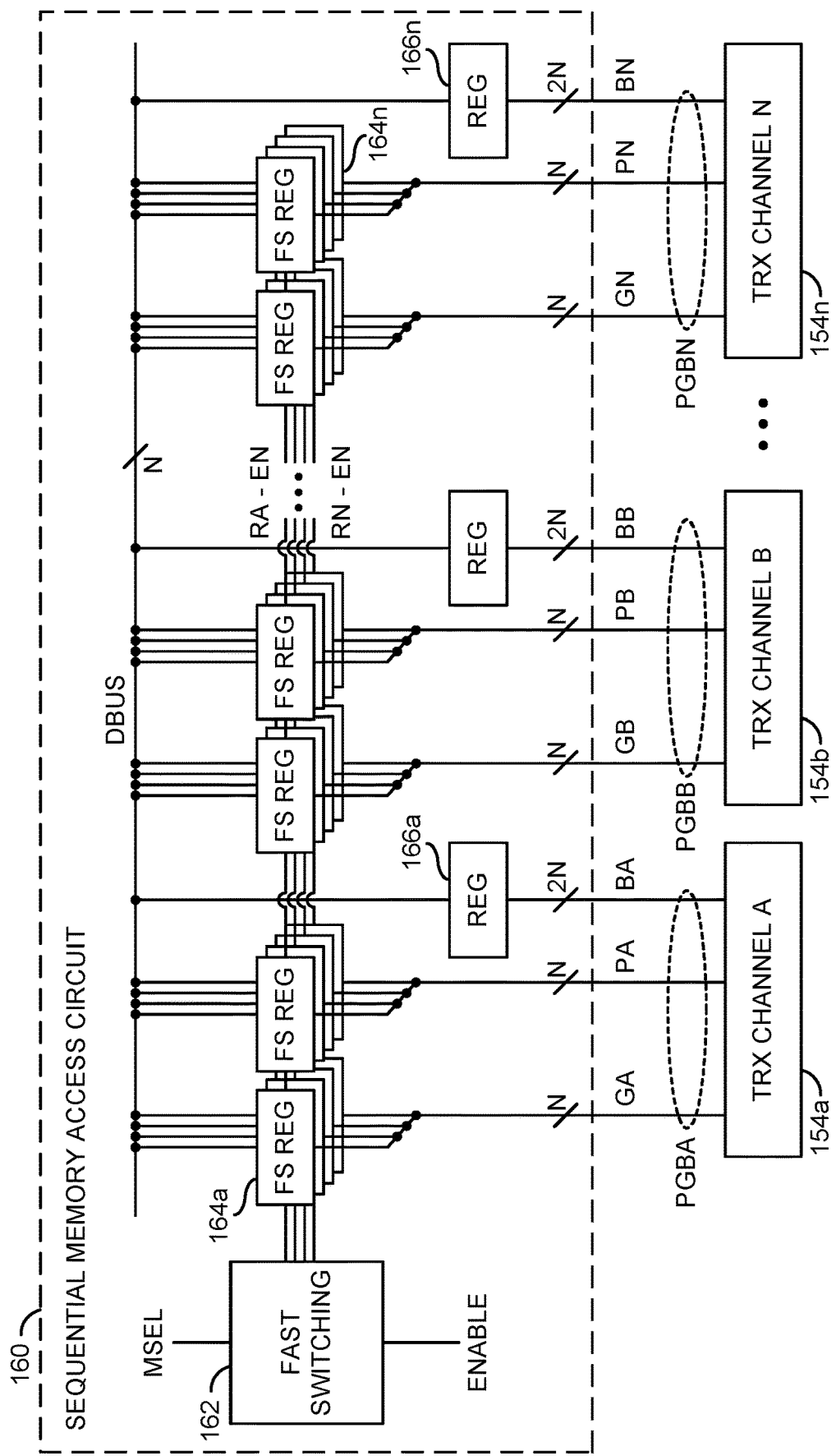
FIG. 7 is a block diagram of a sequential memory access circuit in the beam former circuit of FIG. 2 in accordance with an embodiment of the invention.

Referring to FIG. 7, a block diagram of an example implementation of the access circuit 160 is shown in accordance with an embodiment of the invention. The access circuit 160 generally comprises a block (or circuit) 162, multiple blocks (or circuits) 164a-164n and multiple blocks (or circuits) 166a-166n. The circuits 162-166n may be implemented with hardware, a combination of hardware and software and/or simulated with software.

The mode select signal MSEL may be received by the circuit 162. The circuit 162 may also receive the signal ENABLE. Multiple signals (e.g., RA-EN to RN-EN) may be generated by the circuit 162 and presented to the circuits 164a-164n. The signals RA-EN to RN-EN may implement the register control signals. The bidirectional data bus signal DBUS may be exchanged between the SPI core circuit 150 and the circuits 164a-164n. In some embodiments, data values in the data bus signal DBUS may implement N-bit (e.g., 8-bit or 16-bit) data values. Multiple signals (e.g., GA to GN) may be presented by some of the circuits 164a-164n to the corresponding transceiver channel circuits 154a-154n. Each signal GA to GN may convey a gain value. In various embodiments, the gain values may be N-bit (e.g., 8-bit or 16-bit) values. Multiple signals (e.g., PA to PN) may be presented by some of the circuits 164a-164n to the corresponding transceiver channel circuits 154a-154n. Each signal PA to PN may convey a phase value. The phase values may also be N-bit (e.g., 8-bit or 16-bit) values. Multiple signals (e.g., BA to BN) may be presented by the circuits 166a-166n to the corresponding transceiver channel circuits 154a-154n. Each signal BA to BN may carry a bias value used to trim the transceiver channel circuits 154a-154n. In some embodiments, the bias values in the signals BA to BN may be 2N-bit (e.g., 16-bit or 32-bit) values.

The circuit 162 may implement a fast switching circuit. The fast switching circuit 162 is generally operational to generate a sequence of pulses in the register control signals RA-EN to RN-EN in response to the signal ENABLE and the mode select signal MSEL. The mode select signal MSEL may be in either the enabled state (e.g., a high voltage or a logical one state) or the disable state (e.g., a low voltage or a logical zero state). The enable signal ENABLE may be in either the hold state (or mode) or the transfer state (or mode).

While the mode select signal MSEL is in the enabled state and the signal ENABLE is in, or transitions to, the hold state, the fast switching circuit 160 may deassert all register control signals RA-EN to RN-EN. The circuits 164a-164n may respond to the deasserted register control signals RA-EN to RN-EN by presenting high-impedance states (or conditions) at the buffer output ports (or nodes).

While the mode select signal MSEL is in the enable state and the signal ENABLE is in, or transitions to, the transfer state, the fast switching circuit 160 may be configured to assert one of the register control signals RA-EN to RN-EN at a time. The other register control signals RA-EN to RN-EN may remain deasserted. In various embodiments, the assertions are non-overlapping. Each asserted register control signal RA-EN to RN-EN generally causes the corresponding subset of the circuits 164a-164n to present the buffered gain values and the buffered phase values at the output ports to the transceiver channel circuits 154a-154n. The transceiver channel circuits 154a-154n may use the buffered phase value and the buffered gain values to control the amplitude and relative phases of the radio frequency signals RFV1-RFV(N) and RFH1-RFH(N) thereby steering and/or altering the geometry of the field BEAM.

While the mode select signal MSEL is in the disable state, the fast switching circuit 162 may configure the register control signal RA-EN to follow the signal ENABLE. The register control signals RB-EN to RN-EN may be deasserted. The pulses in the register control signal RA-EN that follow the pulses in the signal ENABLE may be used by a first subset of the circuits 164a-164n and 166a-166n to load the gain values, the phase values and the bias values received from the SPI core circuit 150.

Each circuit 164a-164n may implement a register circuit. Each register 164a-164n is generally operational to buffer an individual gain value or an individual phase value for a corresponding transceiver circuit 154a-154n. The output ports of the registers 164a-164n may be directly connected to input ports (or nodes) of the transceiver channel circuits 154a-154n. In various embodiments, the registers 164a-164n may be configured to hold the N-bit (e.g., 8-bit) values received from and transferred in the signals DBUS, GA to GN and PA to PN. Other storage bit widths may be implemented to meet the design criteria of a particular application.

The registers 164a-164n may be grouped together to form the N subsets (or layers). Each register 164a-164n within a subset may be controlled by a corresponding register control signal RA-EN to RN-EN. While the corresponding register control signal RA-EN is active, all registers 164a-164n within the subset may drive the buffered values through the gain signals GA to GN and the phase signals PA to PN to the corresponding input ports of the transceiver channel circuits 154a-154n. While the corresponding register control signal RA-EN is inactive, all registers 164a-164n within the subset may present a high-impedance state (or condition) at the output nodes. As such, all register 164a-164n that drive the gain signal GA may be hardwired together as a Boolean OR. A similar Boolean OR may be created for each gain signal GB to GN and each phase signal PA to PN.

In operation, a single signal RA-EN to RN-EN may be in the active state at any moment so that each gain signal GA to GN and each phase signal PA to PN is determined by a single register 164a-164n. When the active signal among the register control signals RA-EN to RN-EN changes, the active registers 164a-164n may change causing different gain values and phase values to be presented to the transceiver channel circuits 154a-154n. A time from the changing the active signal among the register control signals RA-EN to RN-EN until the field BEAM is shifted (or adjusted) may be short (e.g., less than 30 nanoseconds).

The circuits 166a-166n may implement register circuits. The registers 166a-166n are generally operational to buffer bias values for the corresponding transceiver channel circuits 154a-154n. In various embodiments, the registers 166a-166n may be configured to hold the 2N-bit (e.g., 16-bit or 32-bit) values received from and transferred in the data bus signal DBUS (N bits at a time) and the signals BA to BN (2N bits at a time). Other storage bit widths may be implemented to meet the design criteria of a particular application.

The registers 166a-166n are generally operated independently from the register 164a-164n. The registers 166a-166n may present the buffered bias values to the transceiver channel circuits 154a-154n in both the transmit mode and the receive mode. The buffered bias values may be presented independently of which register control signal RA-EN to RN-EN is active or inactive.

The phase values, the gain values and the bias values may be written into and read from the registers 164a-164n and 166a-166n by the SPI core circuit 150 several (e.g., 8 or 16) bits at a time. The write data and/or read data may be transferred between the SPI core circuit 150 and the registers 164a-164n and 166a-166n in the data bus signal DBUS. The write/read direction may be based on the signal W/R.

The write data values may be received by the SPI core circuit 150 via the serial input signal MOSI from the controller 68 and the gain/phase table 70. While the signal W/R is in the write state (or mode), the write data values may be presented from the SPI core circuit 150 via the data bus signal DBUS to the registers 164a-164n and 166a-166n. The write data values may be subsequently stored in the registers 164a-164n and 166a-166n.

While the signal W/R is in the read state (or mode), read data values may be read from the registers 164a-164n and 166a-166n. The read data value may be transferred from the registers 164a-164n and 166a-166n via the data bus signal DBUS to the SPI core circuit 150. The SPI core circuit 150 may subsequently transfer the read data values to the controller 68 via the serial output signal MISO.

Figure 8:
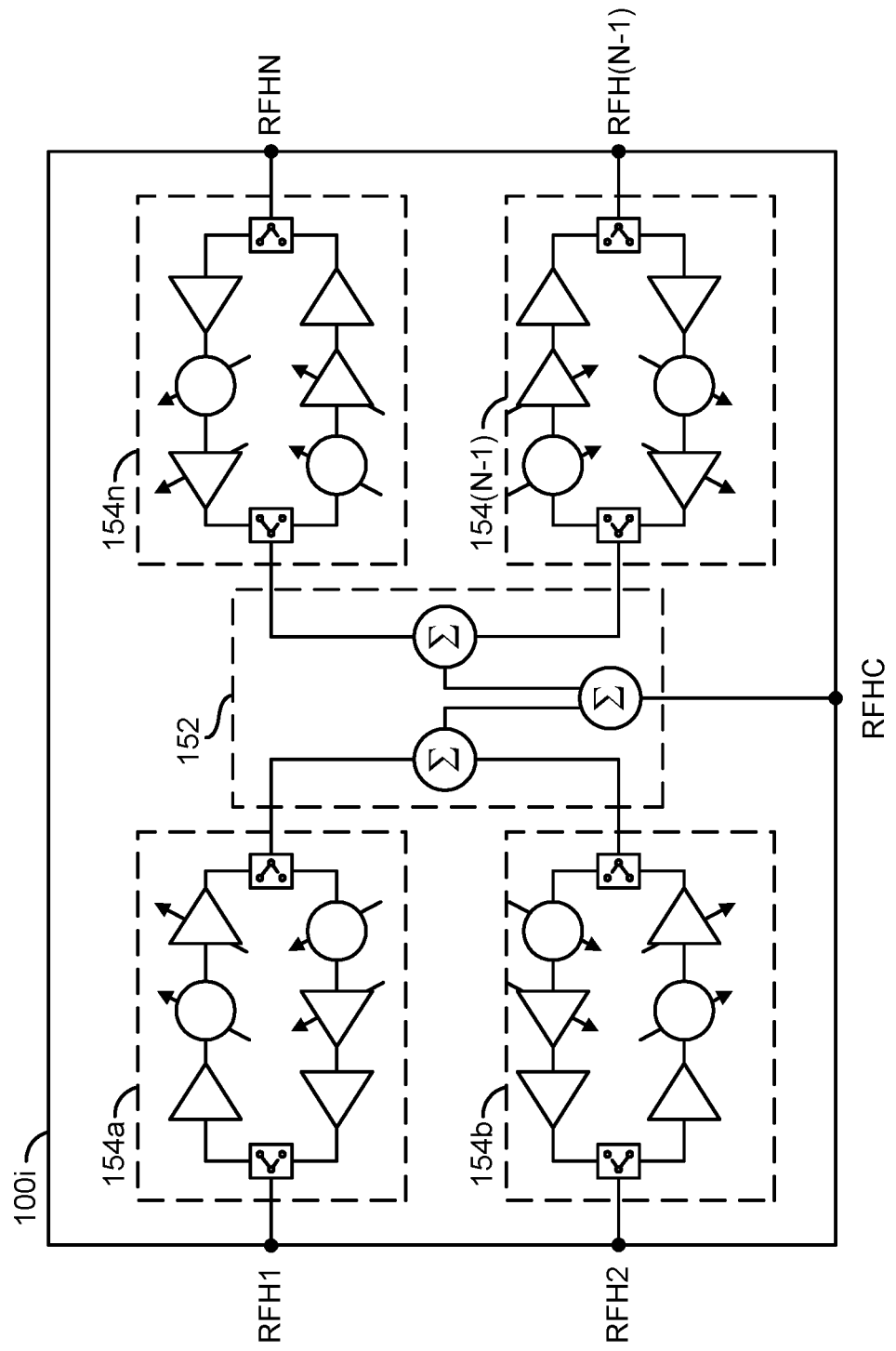
FIG. 8 is a diagram illustrating an example implementation of horizontal channels of the beam former circuit in accordance with an example embodiment of the invention.

Referring to FIG. 8, a diagram is shown illustrating an example implementation of horizontal channels of the beam former circuit 100i in accordance with an example embodiment of the invention. In various embodiments, the beam former circuits 100a-100m may implement a plurality of horizontal transceiver channels and a plurality of vertical transceiver channels. Each horizontal transceiver channel generally comprises a transmit channel and a receive channel. The horizontal transceiver channels (or circuits) 154a-154n may be coupled to horizontal feed ports of respective antenna elements in a group of adjacent antenna elements by corresponding bidirectional radio-frequency signals (e.g., RFH1-RFHN). The horizontal transceiver channels and antenna elements generally form a two-dimensional antenna network. The vertical transceiver channels (or circuits) of the transceiver channels 154a-154n are generally implemented similarly to the horizontal transceiver channels. The transceiver channels (or circuits) of a single-polarization embodiment may also implemented similarly to the horizontal transceiver channels. The vertical transceiver channels (or circuits) of the transceiver channels 154a-154n may be coupled to vertical feed ports of respective antenna elements in a group of adjacent antenna elements by corresponding bidirectional radio-frequency signals (e.g., RFV1-RFVN).

In an example, the circuit 152 may be implemented as a 1-N combiner/splitter network. In an example, the circuit 152 may comprise a number of combiner/splitters. In an example, the combiner/splitters may be implemented as Wilkinson combiner/splitters. In various embodiments, the combiner/splitters may be coupled together to form a network that couples the horizontal transceiver circuits to the common RF input/output port RFHC of the beam former circuit 100i. In the transmit mode, the circuit 152 is generally operational to distribute the power in a signal at the common RF input/output port RFHC among the circuits 154a-154n. In the receive mode, the circuit 152 may be operational to combine the power received in signals from the circuits 154a-154n into a signal presented at the common RF input/output port RFHC. The circuits 154a-154n and 152 are generally configured to provide a substantially equivalent path length between the common RF input/output port RFHC and each of the circuits 154a-154n. The topology of the beam former circuit 100i may be scaled to provide other numbers of transceiver channels to meet the design criteria of a particular implementation.

Figure 9:
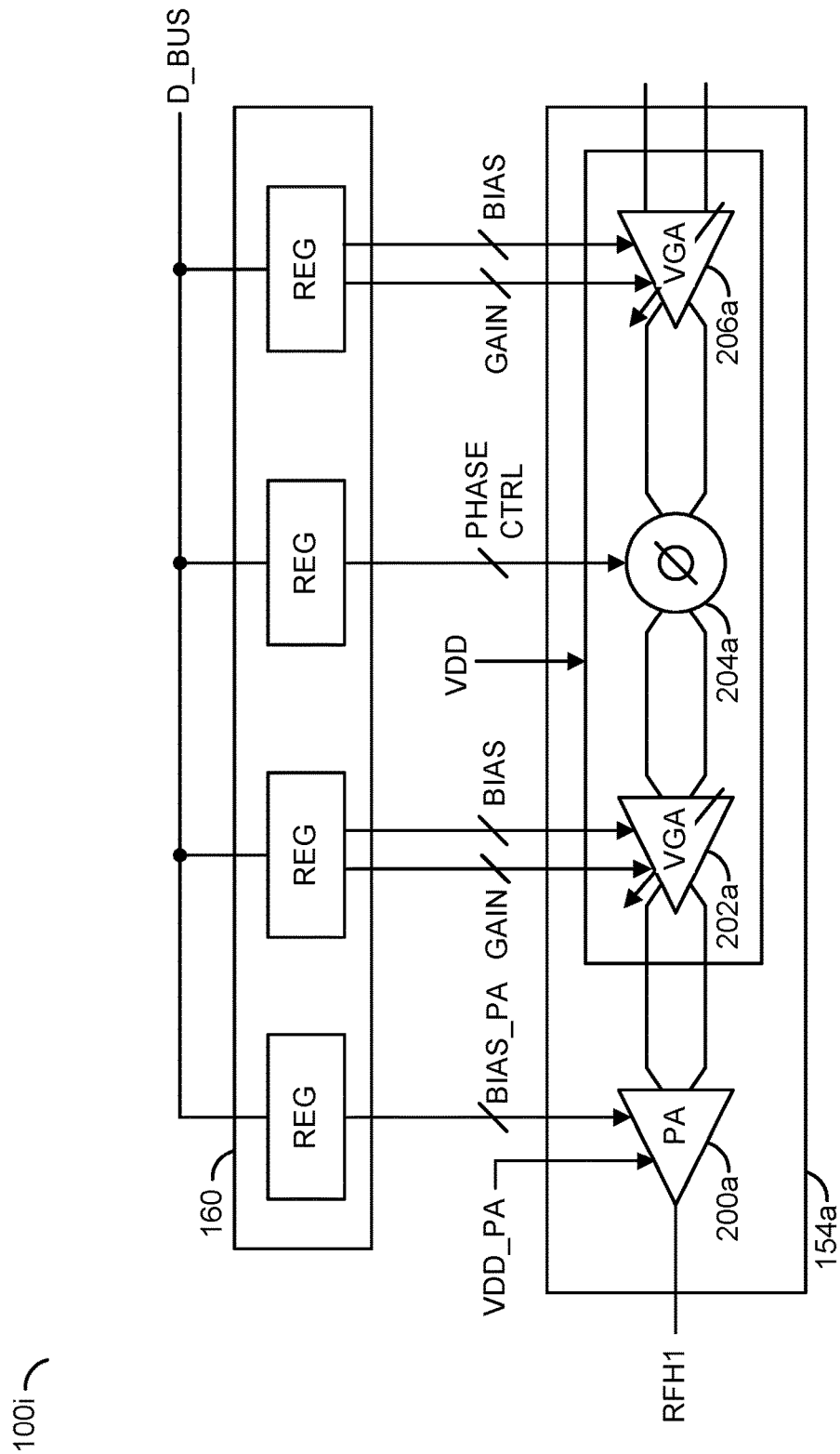
FIG. 9 is a diagram illustrating an example implementation of transmit channel portion of the horizontal transceiver channels of FIG. 6.

Referring to FIG. 9, a diagram illustrating an example implementation of a transmit channel portion of the horizontal transceiver channel 154a of FIG. 8 is shown. In various embodiments, each channel may have independent bias and gain controls in each stage. The independent bias and gain controls generally provide for lowering the power consumption without lowering the gain. In various embodiments, the stages may comprise separate reference current weighting structures that may be programmed separately via the serial interface 150. In an example, the transmit channel portion of the transceiver channel circuit 154a may comprise a power amplifier (PA) stage 200a, a variable gain amplifier (VGA) stage 202a, a variable phase shift stage 204a, and an input amplifier stage 206a. The input amplifier stage 206a may also be implemented as a variable gain amplifier (VGA). In various embodiments, the stages of transceiver channel 154a other than the power amplifier stage 200a may receive a first supply voltage (e.g., VDD), while the power amplifier stage 200a receives a second, separate supply voltage (e.g., VDD_PA). In an example, a separate supply pin for receiving the supply voltage VDD_PA generally provides flexibility to change the supply voltage of the PA stage 200a for improved efficiency. For example, when the target output power is lowered, the supply voltage VDD_PA may also be lowered. In an example, each stage of the transceiver circuit 154a may have a respective register or registers (e.g., implemented as part of the circuit 160) in which respective bias and/or gain values may be programmed. The transmit channels of each of the transceiver channel circuit 154b-154n may be implemented similarly.

Figure 10:
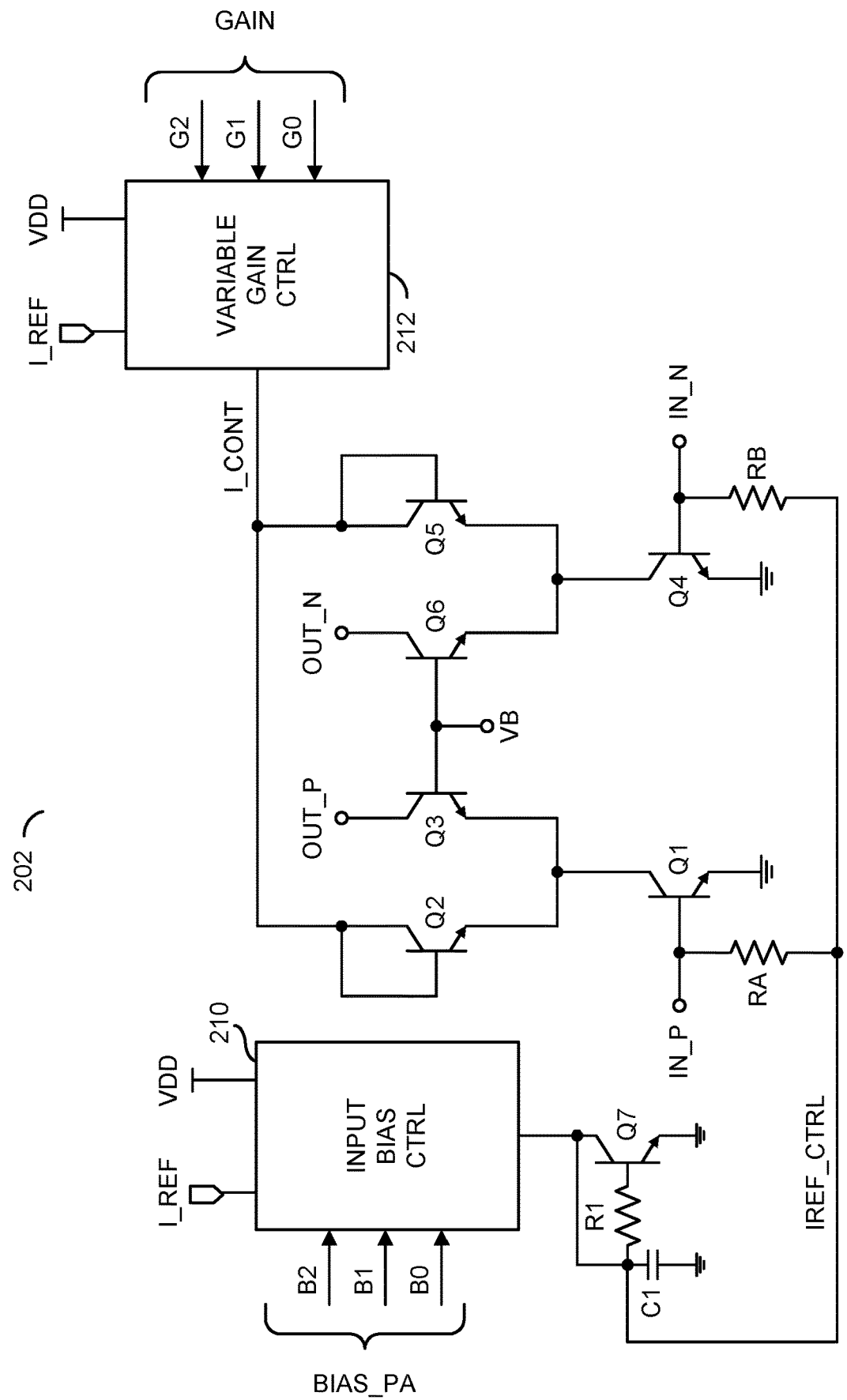
FIG. 10 is a diagram illustrating an example implementation of a variable gain amplifier (VGA) of FIG. 9 in accordance with an example embodiment of the invention.

Referring to FIG. 10, a diagram of a circuit 202 is shown illustrating an example implementation of a variable gain amplifier of FIG. 9 in accordance with an example embodiment of the invention. In various embodiments, gain control may be achieved independently from bias control. By implementing independent gain and bias control, the bias control may be used to lower the power consumption of the channel and to improve or maintain efficiency with lower target output power. In various embodiments, programmability may be provided for different output powers (e.g., 7-10-13 dBm output powers), while keeping the efficiency levels in a range of about 15-20%.

In an example, the circuit 202 may be used to implement the variable gain amplifier stages 202a and 206a of FIG. 9. In various embodiments, the amplifier 202 may implement two cascode amplifiers, one for each half of a differential signal OUT_P and OUT_N. In an example, the circuit 202 may comprise a transistor Q1, a transistor Q2, a transistor Q3, a transistor Q4, a transistor Q5, a transistor Q6, a transistor Q7, a resistor RA, a resistor RB, a resistor R1, a capacitor C1, a circuit 210, and a circuit 212. In various embodiments, each of the transistors Q1-Q7 may be implemented as, but is not limited to, a bipolar junction transistor (BJT), a heterojunction bipolar transistor (HBT), a metal-oxide-semiconductor field-effect transistor (MOSFET), a pseudomorphic high-electron-mobility transistor (pHEMT) and/or a silicon-on-insulator (SOI) transistor. The circuit 210 may implement an input bias control circuit. The circuit 212 may implement a variable gain control circuit.

The transistors Q1 and Q4 generally implement a common emitter portion of the cascode amplifiers. The transistors Q2-Q6 generally implement a common base portion of the cascode amplifiers. An input signal IN_P may be presented to a base terminal of the transistor Q1. An input signal IN_N may be presented to a base terminal of the transistor Q4. A bias signal (e.g., IREF_CTRL) may be applied to the base terminal of the transistor Q1 via the resistor RA. The bias signal IREF_CTRL may be applied to the base terminal of the transistor Q4 via the resistor RB. An emitter terminal of the transistor Q1 and emitter terminal of the transistor Q4 may be connected to a circuit ground potential. A collector terminal of the transistor Q1 may be connected to emitter terminals of the transistors Q2 and Q3. A collector terminal of the transistor Q4 may be connected to emitter terminals of the transistors Q5 and Q6. A base terminal and a collector terminal of the transistor Q2 may be connected to form a node at which a bias signal (e.g., I_CONT) may be presented. A base terminal and a collector terminal of the transistor Q5 may be connected to form a node at which the bias signal I_CONT may be presented. A base terminal of the transistor Q3 and a base terminal of the transistor Q6 may be connected to for a node at which a bias signal VB may be presented. A collector terminal of the transistor Q3 may present the signal OUT_P. A collector terminal of the transistor Q6 may present the signal OUT_N.

In an example, the bias signal VB may be implemented as a fixed direct current (DC) bias voltage at virtual radio-frequency ground for cascode operations. The signal I_CONT may be configured to control a gain of the amplifier circuit 202. In an example, the signal I_CONT may be controlled by a digitally controlled current mirror. In some embodiments, the current mirror may include a digital-to-analog converter. The digital-to-analog converter may have different numbers of digital control bits, depending on a desired resolution of control. The signal IREF_CTRL may be configured to control an input bias level of the amplifier circuit 202. In an example, the signal IREF_CTRL may be controlled by a digitally controlled current mirror. In some embodiments, the current mirror may include a digital-to-analog converter. The digital-to-analog converter may have different numbers of digital control bits, depending on a desired resolution of control.

The circuit 210 may have a first input that may receive a reference signal (e.g., I_REF), a second input that may receive the supply voltage VDD, a third input that may receive the signal BIAS, and an output the may present the signal IREF_CTRL. The circuit 210 may be configured to generate the signal IREF_CTRL in response to the signals I_REF, VDD, and BIAS. The output of the circuit 210 may be connected to a node formed by connection of a terminal of the resistor RA, a terminal of the resistor RB, a first terminal of the resistor R1, a first terminal of the capacitor C1, and a collector terminal of the transistor Q7. A second terminal of the capacitor C1 may be connected to the circuit ground potential. A second terminal of the resistor R1 may be connected to a base terminal of the transistor Q7. An emitter terminal of the transistor Q7 may be connected to the circuit ground potential.

The circuit 212 may have a first input that may receive the reference signal I_REF, a second input that may receive the supply voltage VDD, a third input that may receive the signal GAIN, and an output the may present the signal I_CONT. The circuit 212 may be configured to generate the signal I_CONT in response to the signals I_REF, VDD, and GAIN.

Figure 11:
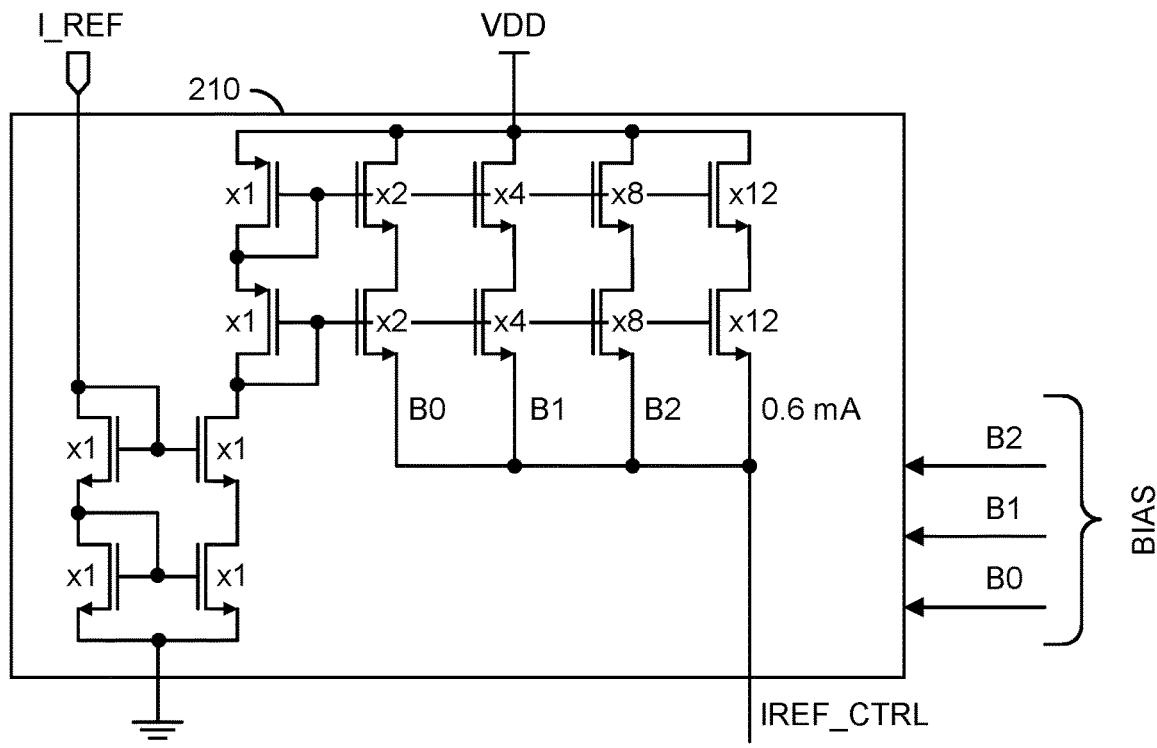
FIG. 11 is a diagram illustrating an example implementation of an input bias current control circuit of FIG. 10 in accordance with an example embodiment of the invention.

Referring to FIG. 11, a diagram of a circuit 210 is shown illustrating an example implementation of the input bias control circuit of FIG. 10 in accordance with an example embodiment of the invention. In an example, the circuit 210 may implement a programmable reference current weighting structure. In an example, the circuit 210 may implement a digitally controlled current mirror. The circuit 210 may receive the supply voltage VDD, the reference signal I_REF, and the signal BIAS. The circuit 210 may be configured to generate the signal IREF_CTRL in response to the reference signal I_REF, the supply voltage VDD, and a number of programmable bits (e.g., B0-B2) of the signal BIAS. The bits B0-B2 may be programmed via the interface 150 to set a bias level of the input stage of the amplifier circuit 202. The circuit 210 generally comprises a number of transistors with different sizes (e.g., x1, x2, x4, x8, x12, etc.) configured to provide a number of binary steps in response to the signal BIAS. In an example, each of the transistors of the circuit 210 may be implemented as, but is not limited to, a bipolar junction transistor (BJT), a heterojunction bipolar transistor (HBT), a metal-oxide-semiconductor field-effect-transistor (MOSFET), a pseudomorphic high electron mobility transistor (pHEMT), and/or a silicon-on-insulator (SOI) transistor. In an example, the circuit 202 may be configured to generate the signal IREF_CTRL according to the following TABLE 2:

TABLE 2

| | IREF_CTRL | B2 | B1 | B0 |
|---|---|---|---|---|
| I min | 0.6 mA | 0 | 0 | 0 |
| I nom | 1 mA | 1 | 0 | 0 |
| I max | 1.3 mA | 1 | 1 | 1 |

In various embodiments, the values and the number of control bits (B0-B2) may be varied from the examples shown in TABLE 2 to meet the design criteria (e.g., desired resolution) of a particular implementation. In an example, a minimum bias current I_min generally provides the lowest power consumption as well as lowers output power. The efficiency and power of the amplifier circuit 202 may be optimized with combinations of gain control, bias control, and the supply voltage VDD, either simultaneously or separately.

Figure 12:
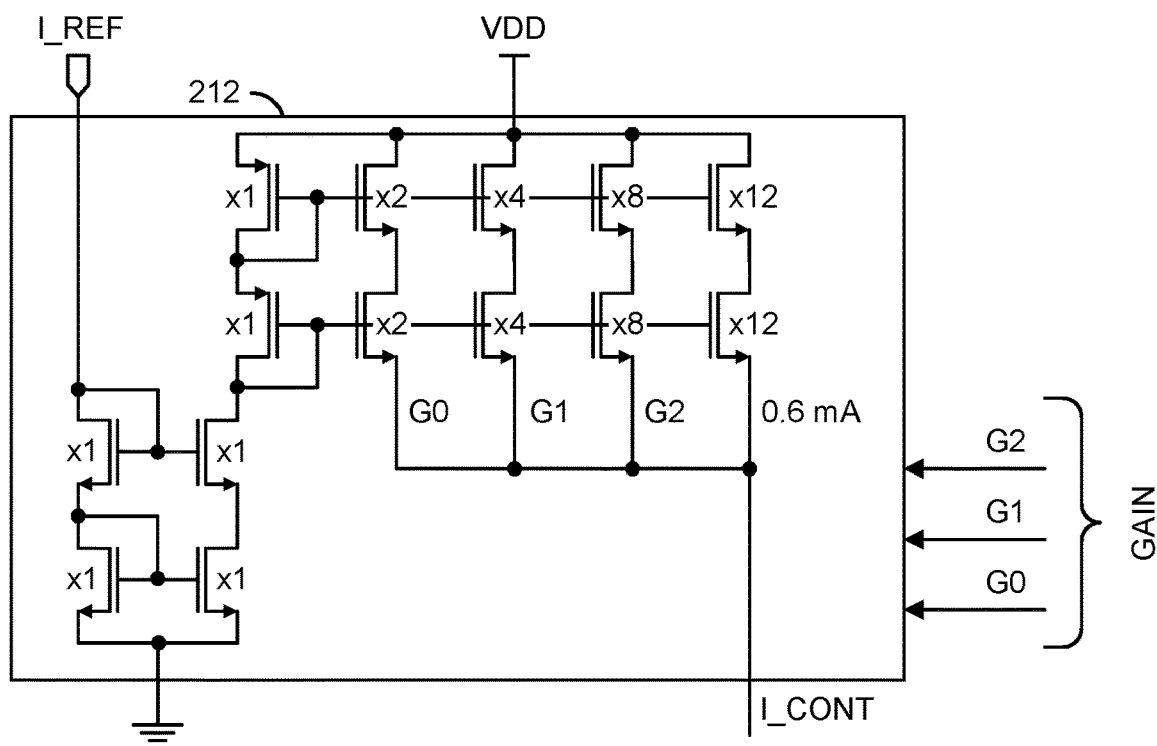
FIG. 12 is a diagram illustrating an example implementation of a variable gain control circuit of FIG. 10 in accordance with an example embodiment of the invention.

Referring to FIG. 12, a diagram of a circuit 212 is shown illustrating an example implementation of the gain control circuit of FIG. 10 in accordance with an example embodiment of the invention. In an example, the circuit 212 may implement a programmable reference current weighting structure. In an example, the circuit 212 may implement a digitally controlled current mirror. The circuit 212 may receive the supply voltage VDD, the reference signal I_REF, and the signal GAIN. The circuit 212 may be configured to generate the signal I_CONT in response to the reference signal I_REF, the supply voltage VDD, and a number of programmable bits (e.g., G0-G2) of the signal GAIN. The bits G0-G2 may be programmed via the interface 150 to set a gain level of the amplifier circuit 202. The circuit 212 generally comprises a number of transistors with different sizes (e.g., x1, x2, x4, x8, x12, etc.) configured to provide a number of binary steps in response to the signal GAIN. In an example, each of the transistors of the circuit 212 may be implemented as, but is not limited to, a bipolar junction transistor (BJT), a heterojunction bipolar transistor (HBT), a metal-oxide-semiconductor field-effect-transistor (MOSFET), a pseudomorphic high electron mobility transistor (pHEMT), and/or a silicon-on-insulator (SOI) transistor. In an example, the circuit 212 may be configured to generate the signal I_CONT according to the following TABLE 3:

TABLE 3

| | I_CONT | G2 | G1 | G0 |
|---|---|---|---|---|
| I min | 0.6 mA | 0 | 0 | 0 |
| I nom | 1 mA | 1 | 0 | 0 |
| I max | 1.3 mA | 1 | 1 | 1 |

In various embodiments, the values and the number of control bits (G0-G2) may be varied from the examples shown in TABLE 3 to meet the design criteria (e.g., desired resolution) of a particular implementation. In an example, a minimum bias current I_min generally provides the lowest power consumption as well as lowers output power. The efficiency and power of the amplifier circuit 202 may be optimized with combinations of gain control, bias control, and the supply voltage VDD, either simultaneously or separately.

Figure 13:
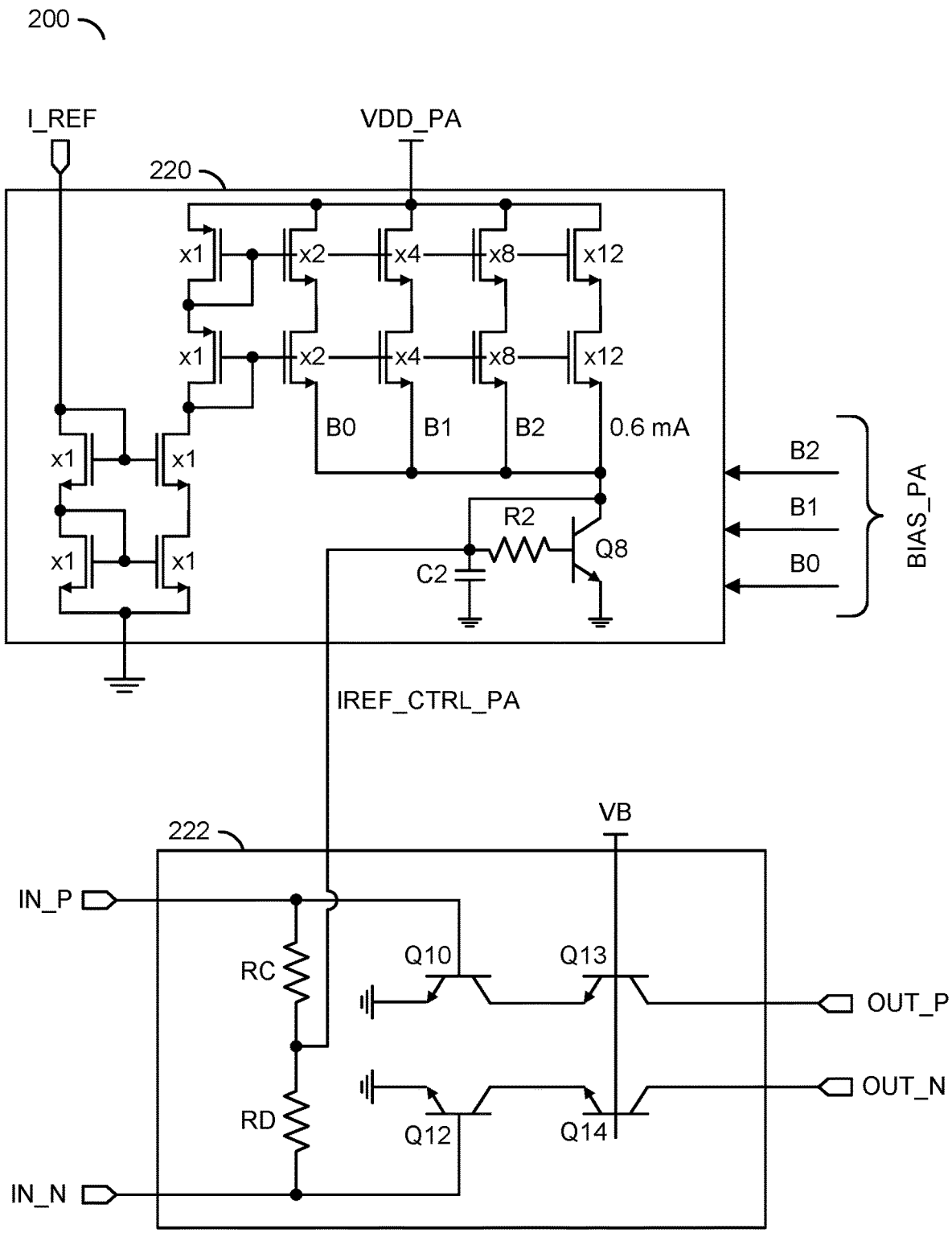
FIG. 13 is a diagram illustrating an example implementation of a power amplifier of FIG. 9 in accordance with an example embodiment of the invention.

Referring to FIG. 13, a diagram of a circuit 200 is shown illustrating an example implementation of a power amplifier of FIG. 9 in accordance with an example embodiment of the invention. In an example, the circuit 200 may comprise a circuit 220 and a circuit 222. The circuit 220 may implement a programmable reference current weighting structure. The circuit 222 may be implemented as a cascode power amplifier. The circuit 220 may receive the dedicated power amplifier supply voltage VDD_PA and the reference signal I_REF. The circuit 220 may be configured to generate the signal IREF_CTRL in response to the reference signal I_REF, the dedicated power amplifier supply voltage VDD_PA, and a number of programmable bits (e.g., B0-B2)

of a power amplifier bias control signal (e.g., BIAS_PA). The bits B0-B2 may be programmed via the interface 150 to set a bias level of an input stage of the amplifier circuit 222.

The circuit 220 generally comprises a number of transistors with different sizes (e.g., x1, x2, x4, x8, x12, etc.) configured to provide a number of binary steps in response to the signal BIAS_PA, a transistor Q8, a resistor R2, and a capacitor C2. In an example, each of the transistors of the circuit 220 may be implemented as, but is not limited to, a bipolar junction transistor (BJT), a heterojunction bipolar transistor (HBT), a metal-oxide-semiconductor field-effect-transistor (MOSFET), a pseudomorphic high electron mobility transistor (pHEMT), and/or a silicon-on-insulator (SOI) transistor. The circuit 220 may be configured to generate the signal IREF_CTRL in response to the signals I_REF, VDD_PA, and BIAS_PA. In an example, an output of the programmable reference current weighting structure may be connected to a node formed by connection of a first terminal of the resistor R2, a first terminal of the capacitor C2, and a collector terminal of the transistor Q8. A second terminal of the capacitor C2 may be connected to the circuit ground potential. A second terminal of the resistor R2 may be connected to a base terminal of the transistor Q8. An emitter terminal of the transistor Q8 may be connected to the circuit ground potential. In an example, the circuit 220 may be configured to generate the signal IREF_CTRL according to the following TABLE 4:

TABLE 4

|  | IREF_CTRL | B2 | B1 | B0 |
|---|---|---|---|---|
| I min | 0.6 mA | 0 | 0 | 0 |
| I nom | 1 mA | 1 | 0 | 0 |
| I max | 1.3 mA | 1 | 1 | 1 |

In various embodiments, the values and the number of control bits (B0-B2) may be varied from the examples shown in TABLE 4 to meet the design criteria (e.g., desired resolution) of a particular implementation. In an example, a minimum bias current I_min generally provides the lowest power consumption as well as lowers output power. The efficiency and power of the amplifier circuit 222 may be optimized with combinations of gain control, bias control, and the supply voltage VDD PA, either simultaneously or separately.

In an example, the circuit 222 may implement two cascode amplifiers, one for each half of a differential signal OUT_P and OUT_N. In an example, the circuit 222 may comprise a transistor Q10, a transistor Q12, a transistor Q13, a transistor Q14, a resistor RC, and a resistor RD. In various embodiments, each of the transistors Q10-Q14 may be implemented as, but is not limited to, a bipolar junction transistor (BJT), a heterojunction bipolar transistor (HBT), a metal-oxide-semiconductor field-effect transistor (MOSFET), a pseudomorphic high-electron-mobility transistor (pHEMT) and/or a silicon-on-insulator (SOI) transistor.

The transistors Q10 and Q12 generally implement a common emitter portion of the cascode amplifiers. The transistors Q13 and Q14 generally implement a common base portion of the cascode amplifiers. An input signal IN_P may be presented to a base terminal of the transistor Q10. An input signal IN_N may be presented to a base terminal of the transistor Q12. The bias signal IREF_CTRL may be applied to a base terminal of the transistor Q10 and a base terminal of the transistor Q12 via the resistors RC and RD, respectively. An emitter terminal of the transistor Q10 and emitter terminal of the transistor Q12 may be connected to a circuit ground potential. A collector terminal of the transistor Q10 may be connected to an emitter terminal of the transistor Q13. A collector terminal of the transistor Q12 may be connected to an emitter terminal of the transistor Q14. A base terminal of the transistor Q13 and a base terminal of the transistor Q14 may be connected to for a node at which a bias signal VB may be presented. A collector terminal of the transistor Q13 may present the signal OUT_P. A collector terminal of the transistor Q14 may present the signal OUT_N.

In an example, the bias signal VB may be implemented as a fixed direct current (DC) bias voltage at virtual radio-frequency ground for cascode operations. The signal IREF_CTRL may be configured to control an input bias level of the amplifier circuit 222. In an example, the signal IREF_CTRL may be controlled by a digitally controlled current mirror. In some embodiments, the current mirror may include a digital-to-analog converter. The digital-to-analog converter may have different numbers of digital control bits, depending on a desired resolution of control.

Although embodiments of the invention have been described in the context of a 5G application, the present invention is not limited to 5G applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G) specifications or future specifications.

The functions and structures illustrated in the diagrams of FIGS. 1 to 13 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The various signals described above are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet design criteria of a particular implementation.

The use of letters (e.g., 100a-100m, RF1-RFN, etc.) are intended to indicate that any number of the corresponding index may be implemented while staying within the scope of the invention. The letters should not be construed as requiring particular relationships or relative magnitudes between the various labels in which the letters are used. The number of elements specified using letters may be different or similar. In an example, the hard-wired address used as a chip ID for the beam former circuits 100a-100m may be implemented as six bits (e.g., 64 possible addresses) while the number antenna input/outputs (or transceiver channels) RF1-RFN may be implemented as four. In another example, the hard-wired address may be implemented as six bits while the number antenna input/outputs (or transceiver channels) RF1-RFN may be implemented as eight.

While the invention has been particularly shown and described with reference to embodiments thereof, it will be understood by those skilled in the art that various changes in form and details may be made without departing from the scope of the invention.

The invention claimed is:

1. An apparatus comprising:
a phased array antenna panel comprising a plurality of antenna elements, wherein said plurality of antenna elements are arranged in one or more groups; and
one or more beam former circuits mounted on the phased array antenna panel, each beam former circuit coupled to a respective group of said antenna elements, each beam former circuit comprising (i) a combiner-splitter network coupled to a common radio frequency port and (ii) a plurality of transceiver channel circuits, each transceiver channel circuit coupled between said combiner-splitter network and a respective radio frequency input/output, each transceiver channel circuit comprising a power amplifier circuit configured, when operating in a transmit mode, to drive a respective one of said antenna elements connected to the respective radio frequency input/output, wherein said power amplifier circuit comprises separate bias and voltage supply inputs providing additional power control and said bias input to said power amplifier circuit is provided by a programmable reference current weighting structure.

2. The apparatus according to claim 1, wherein the phased array antenna panel is configured to operate in a frequency range comprising at least one of a radio frequency band, a milli-meter wave frequency band, and a microwave frequency band.

3. The apparatus according to claim 1, wherein the power amplifier circuit further comprises a separate bias scheme from other amplifiers of each transceiver channel circuit.

4. The apparatus according to claim 3, wherein said separate bias scheme maintains efficiency while lowering output power of said power amplifier circuit.

5. The apparatus according to claim 1, wherein each of the transceiver channel circuits comprises one or more amplifier circuits and at least one of said amplifier circuits has a gain controlled in response to a respective gain control signal and a bias level controlled in response to a respective bias control signal.

6. The apparatus according to claim 5, wherein a gain value and a bias value for said at least one of said amplifier circuits is stored in respective registers associated with said at least one of said amplifier circuits.

7. The apparatus according to claim 1, wherein said programmable reference current weighting structure is programmed by storing a bias value in a respective register associated with said power amplifier circuit.

8. The apparatus according to claim 7, wherein said programmable reference current weighting structure comprises a number of transistors with different sizes configured to provide a number of binary steps in response to the bias value stored in said respective register associated with said power amplifier circuit.

9. The apparatus according to claim 8, wherein said number of transistors with different sizes comprise one or more of a bipolar junction transistor (BJT), a heterojunction bipolar transistor (HBT), a metal-oxide-semiconductor field-effect-transistor (MOSFET), a pseudomorphic high electron mobility transistor (pHEMT), and/or a silicon-on-insulator (SOI) transistor.

10. A beam former architecture comprising:
a combiner-splitter network coupled to a common radio frequency port; and
a plurality of transceiver channel circuits, each transceiver channel circuit coupled between said combiner-splitter network and a respective radio frequency input/output, each transceiver channel circuit comprising a power amplifier circuit configured, when operating in a transmit mode, to drive an antenna element connected to the respective radio frequency input/output, wherein said power amplifier circuit comprises separate bias and voltage supply inputs providing additional power control and said bias input to said power amplifier circuit is provided by a programmable reference current weighting structure.

11. The beam former architecture according to claim 10, further comprising a memory configured to store a plurality of phase, gain and bias values for each of said transceiver channel circuits.

12. The beam former architecture according to claim 10, wherein the power amplifier circuit further comprises a separate bias scheme from other amplifiers of each transceiver channel circuit.

13. The beam former architecture according to claim 12, wherein said separate bias scheme maintains efficiency while lowering output power of said power amplifier circuit.

14. The beam former architecture according to claim 10, wherein said programmable reference current weighting structure is programmed by storing a bias value in a respective register associated with said power amplifier circuit.

15. The beam former architecture according to claim 14, wherein said programmable reference current weighting structure comprises a number of transistors with different sizes configured to provide a number of binary steps in response to the bias value stored in said respective register associated with said power amplifier circuit.

16. The beam former architecture according to claim 15, wherein said number of transistors with different sizes comprise one or more of a bipolar junction transistor (BJT), a heterojunction bipolar transistor (HBT), a metal-oxide-semiconductor field-effect-transistor (MOSFET), a pseudomorphic high electron mobility transistor (pHEMT), and/or a silicon-on-insulator (SOI) transistor.

17. A method of biasing a beam former power amplifier for additional power control comprising:

arranging a plurality of antenna elements of a phased array antenna panel in one or more groups; and mounting one or more beam former circuits on the phased array antenna panel;

coupling each beam former circuit to a respective group of said antenna elements, wherein each beam former circuit comprises (i) a combiner-splitter network coupled to a common radio frequency port and (ii) a plurality of transceiver channel circuits, each transceiver channel circuit coupled between said combiner-splitter network and a respective radio frequency input/output, each transceiver channel circuit including a transmit channel and a receive channel comprising a power amplifier circuit configured, when operating in a transmit mode, to drive a respective one of said antenna elements connected to the respective radio frequency input/output;

distributing a first power supply voltage to said power amplifier circuit of each of the plurality of transceiver channel circuits and a second power supply voltage to circuitry of each of the plurality of transceiver channel circuits other than said power amplifier circuit; and receiving separate bias and voltage supply inputs at said power amplifier circuit, wherein said separate bias and voltage supply inputs are configured to provide additional power control and said bias input to said power amplifier circuit is provided by a programmable reference current weighting structure.

18. The method according to claim 17, wherein efficiency and power of said power amplifier circuit is optimized by a combination of controlling the separate bias and voltage supply inputs, either simultaneously or separately.

* * * * *